United States Patent
Takayama et al.

(10) Patent No.: US 9,006,812 B2
(45) Date of Patent: Apr. 14, 2015

(54) NONVOLATILE SEMICONDUCTOR MEMORY DEVICE AND METHOD FOR MANUFACTURING THE SAME

(71) Applicant: Kabushiki Kaisha Toshiba, Minato-ku (JP)

(72) Inventors: Karin Takayama, Mie-Ken (JP); Koichi Matsuno, Mie-Ken (JP); Naoki Kai, Mie-Ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/014,702

(22) Filed: Aug. 30, 2013

(65) Prior Publication Data

US 2014/0284689 A1   Sep. 25, 2014

(30) Foreign Application Priority Data

Mar. 22, 2013  (JP) ................. 2013-061135

(51) Int. Cl.
*H01L 29/788* (2006.01)
*H01L 21/762* (2006.01)
*H01L 27/115* (2006.01)

(52) U.S. Cl.
CPC .... *H01L 27/11568* (2013.01); *H01L 21/76224* (2013.01); *H01L 27/11573* (2013.01)

(58) Field of Classification Search
USPC ................. 257/314–316, 319, 324
See application file for complete search history.

(56) References Cited

U.S. PATENT DOCUMENTS

| | | | |
|---|---|---|---|
| 4,855,800 A * | 8/1989 | Esquivel et al. | 257/316 |
| 6,833,602 B1 * | 12/2004 | Mehta | 257/501 |
| 7,847,337 B2 | 12/2010 | Iwase et al. | |
| 7,994,587 B2 | 8/2011 | Endo et al. | |
| 8,044,513 B2 | 10/2011 | Endo | |
| 8,241,984 B2 | 8/2012 | Iwase et al. | |
| 2008/0213971 A1 * | 9/2008 | Mitsuhira et al. | 438/427 |
| 2008/0308859 A1 | 12/2008 | Iwase et al. | |
| 2010/0006946 A1 | 1/2010 | Endo | |
| 2011/0053363 A1 | 3/2011 | Iwase et al. | |

FOREIGN PATENT DOCUMENTS

| | | |
|---|---|---|
| JP | 2008/311312 | 12/2008 |
| JP | 2010-21493 | 1/2010 |
| JP | 2010-212506 | 9/2010 |

* cited by examiner

*Primary Examiner* — Hung Vu
(74) *Attorney, Agent, or Firm* — Oblon, McClelland, Maier & Neustadt, L.L.P.

(57) ABSTRACT

In general, according to one embodiment, a nonvolatile semiconductor memory device includes a memory cell region and a peripheral region. The memory cell region includes first element isolation regions, first semiconductor regions, a first gate insulating film, a charge storage layer, a second gate insulating film, and a control gate electrode. The first element isolation regions separate a semiconductor layer and include a first insulating film. The first semiconductor regions are separated by the first element isolation regions. The peripheral region includes a second element isolation region a second insulating film. Each of the first element isolation regions includes a first and a second portion. A step is present between the first and the second portion. At least part of a side surface and a lower end of the second element isolation region are surrounded by the semiconductor layer.

10 Claims, 21 Drawing Sheets

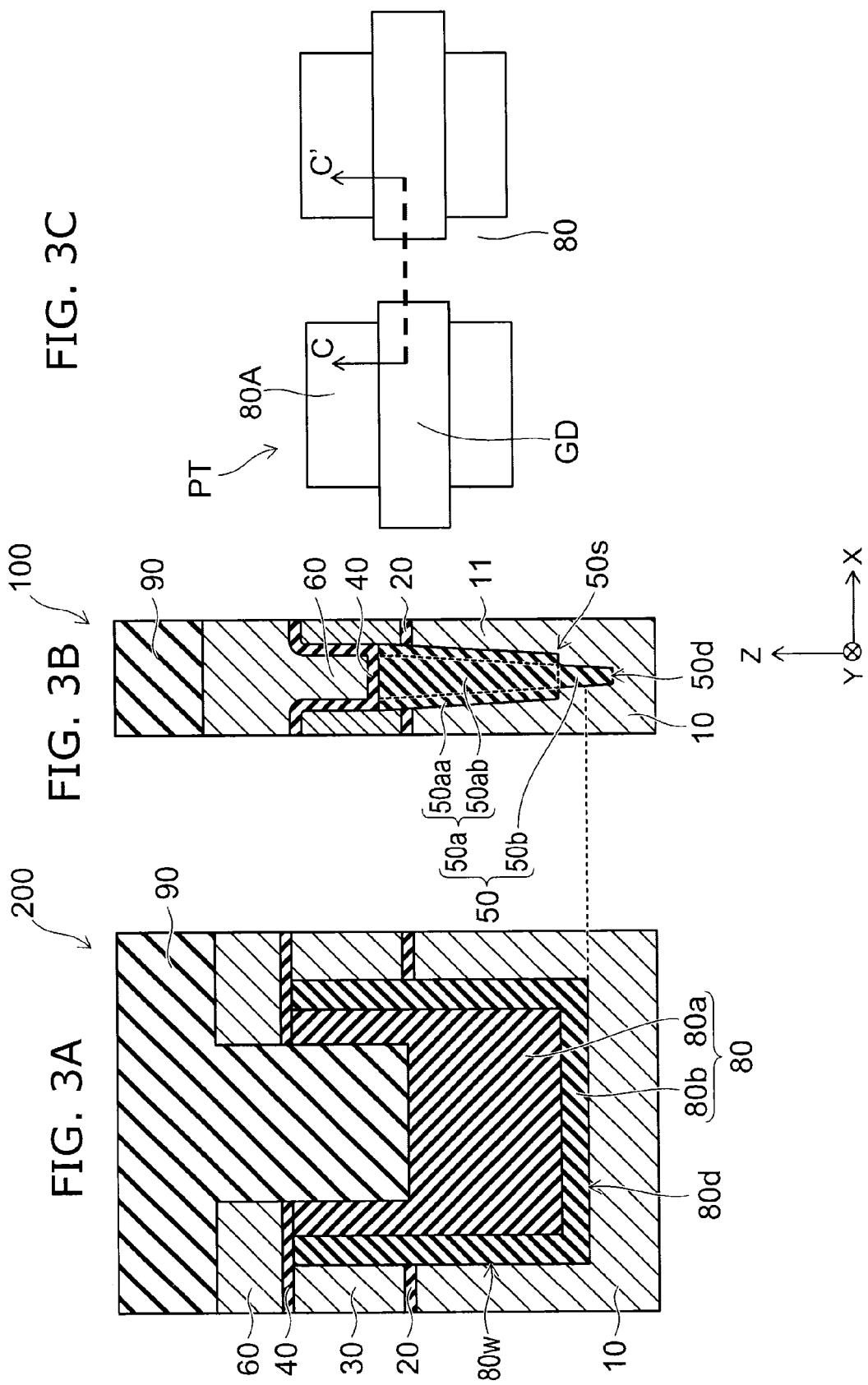

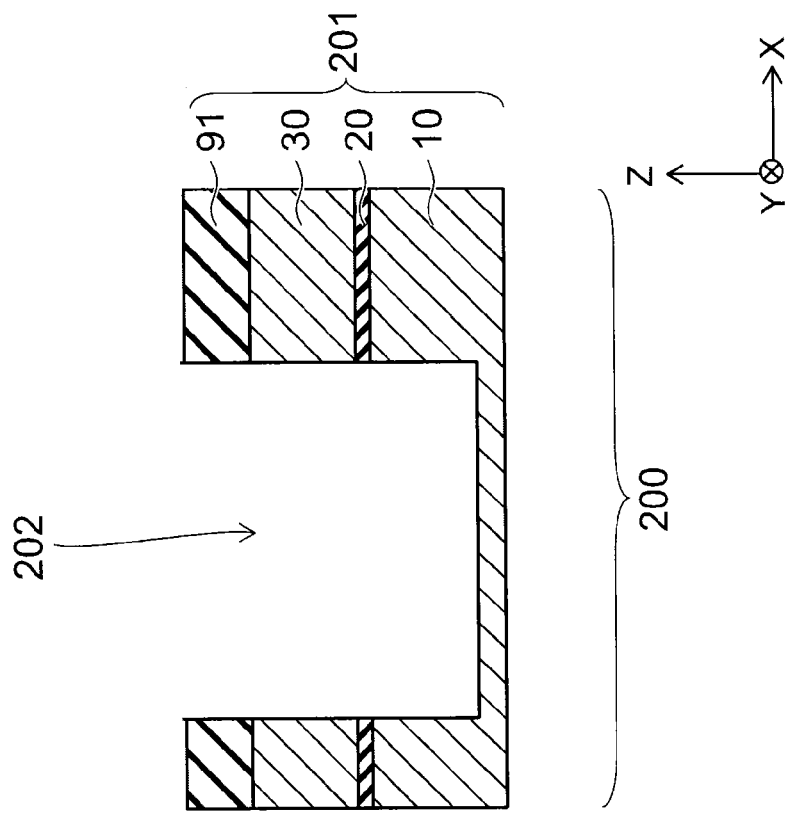
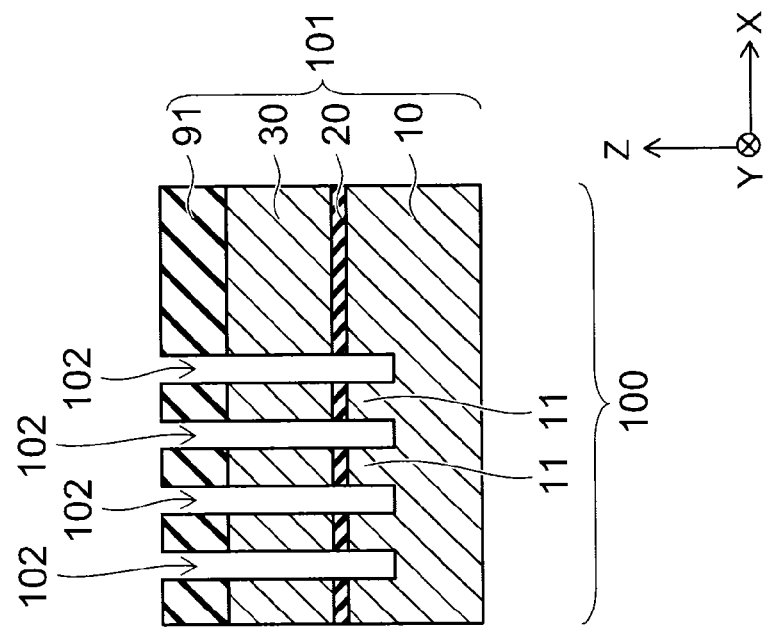

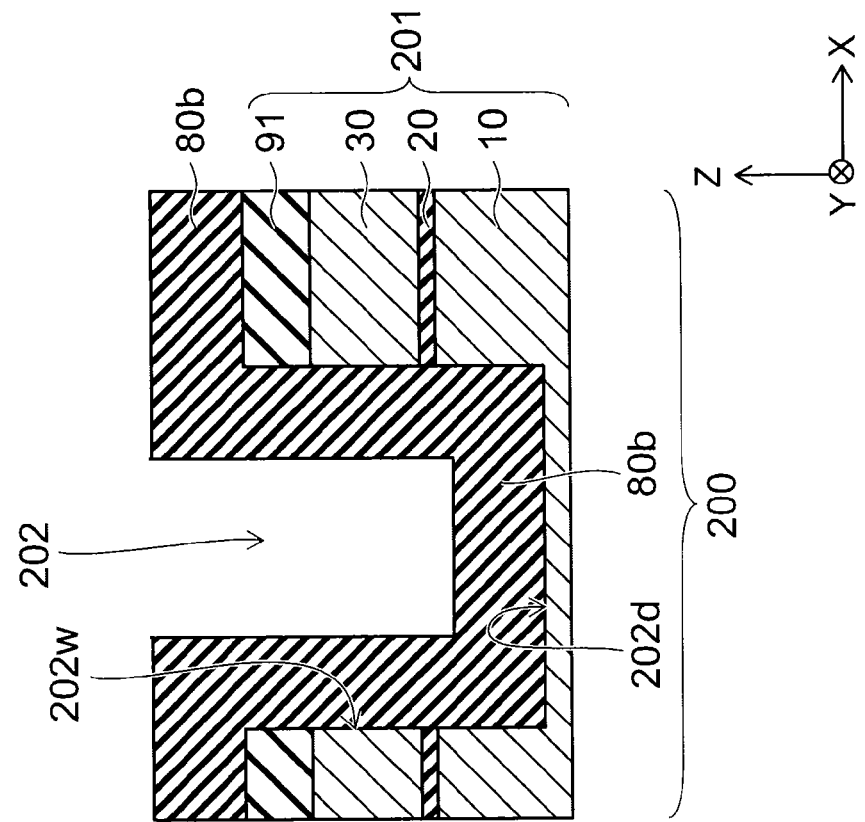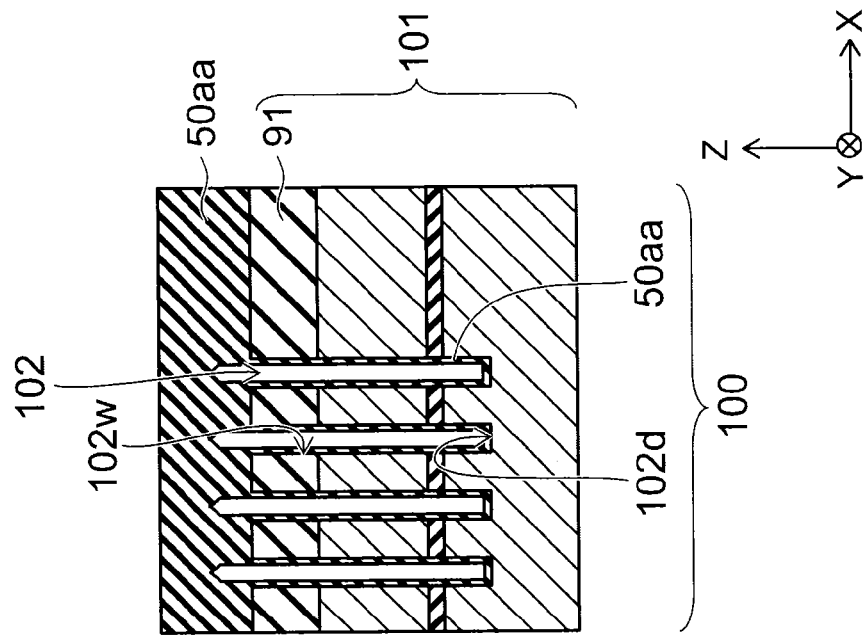

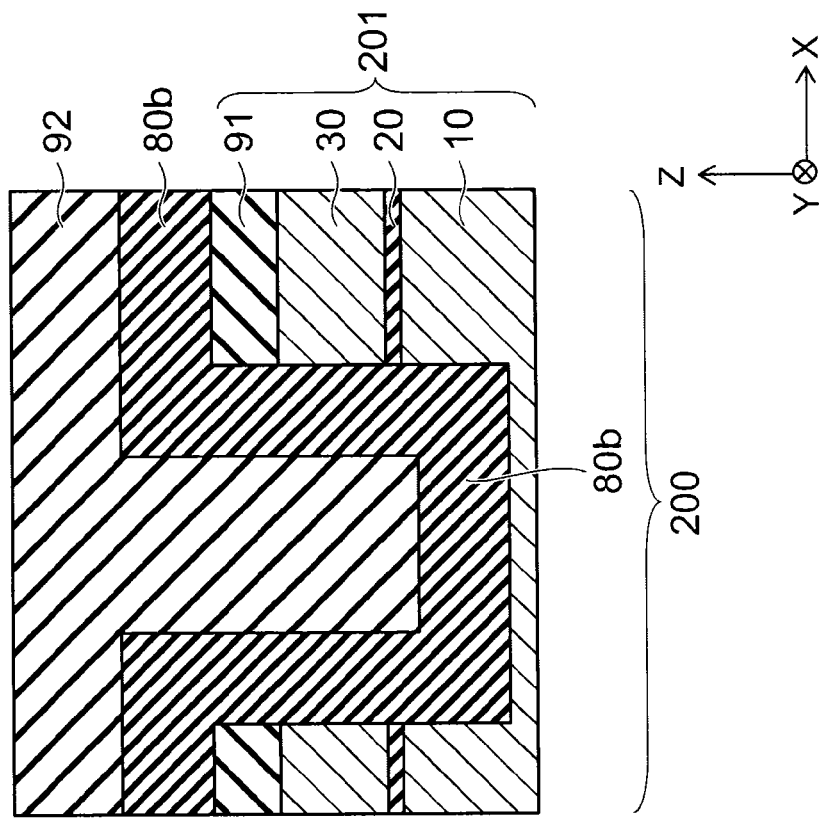
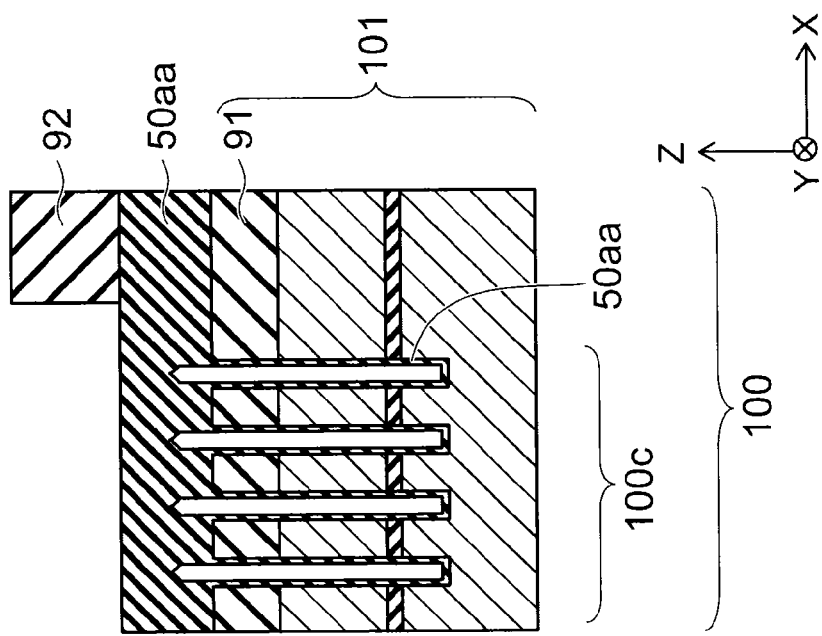

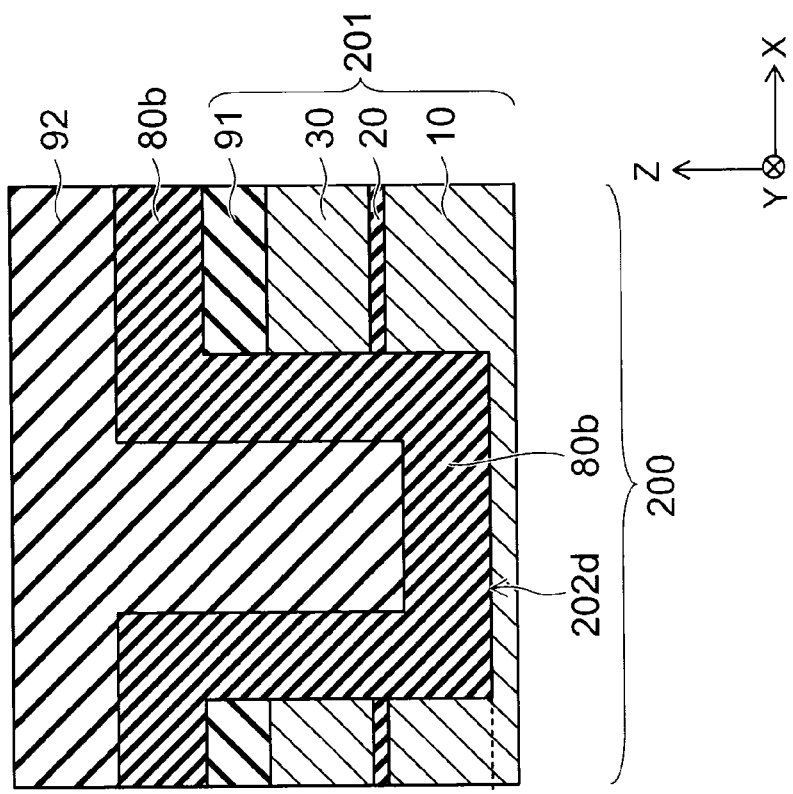
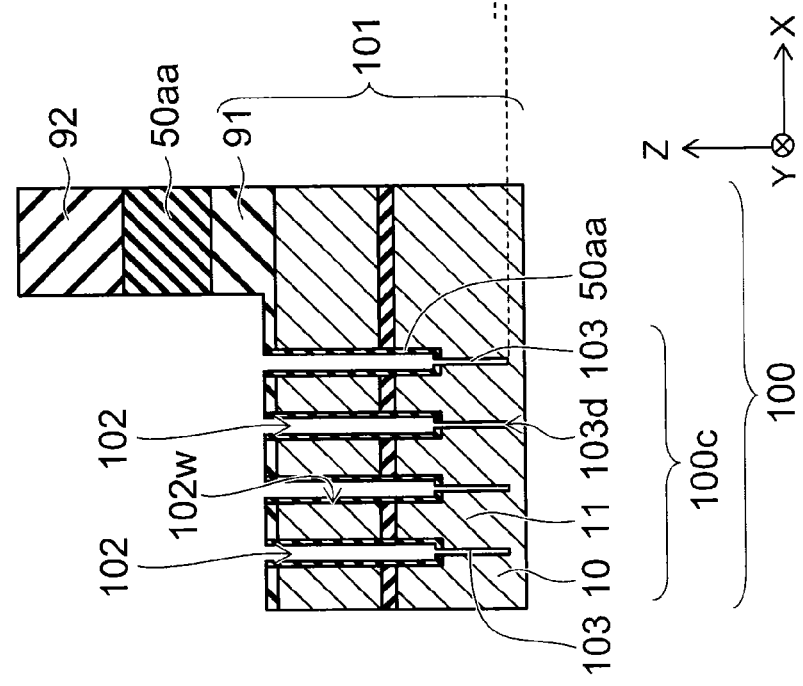

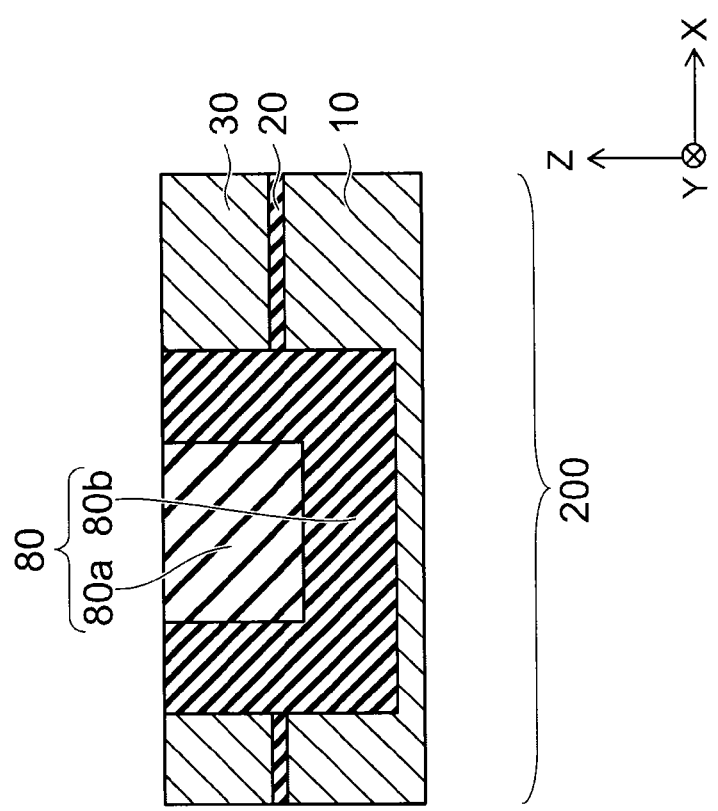

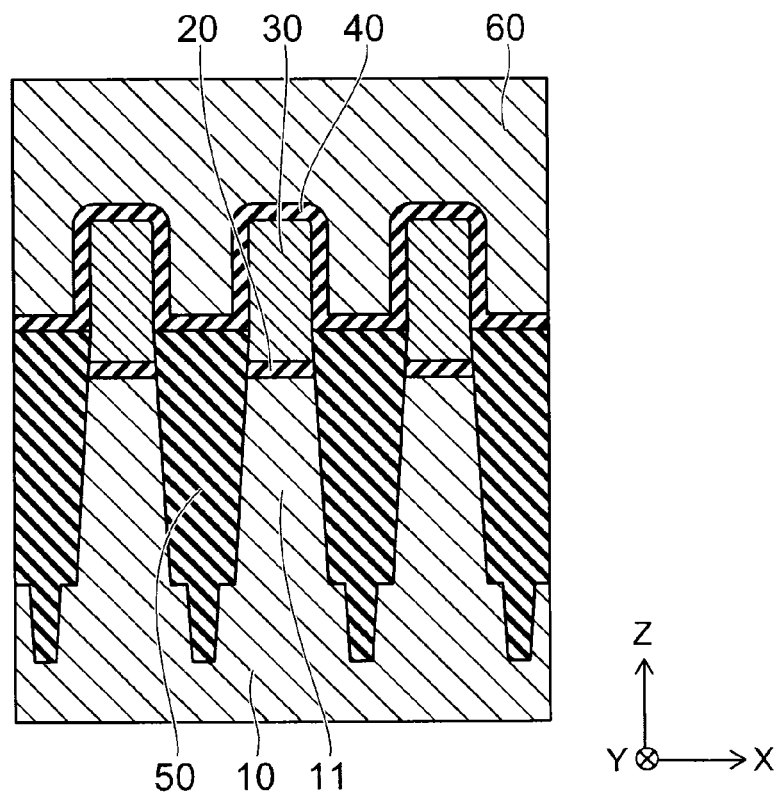
FIG. 14A
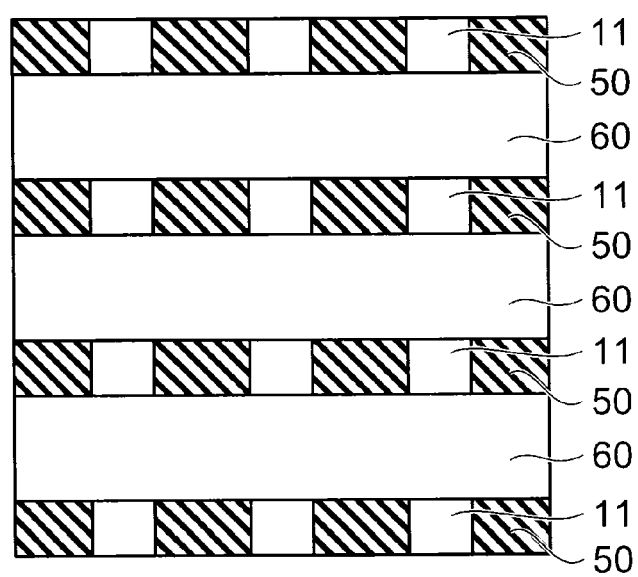
FIG. 14B
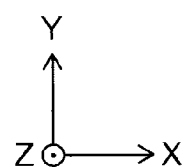

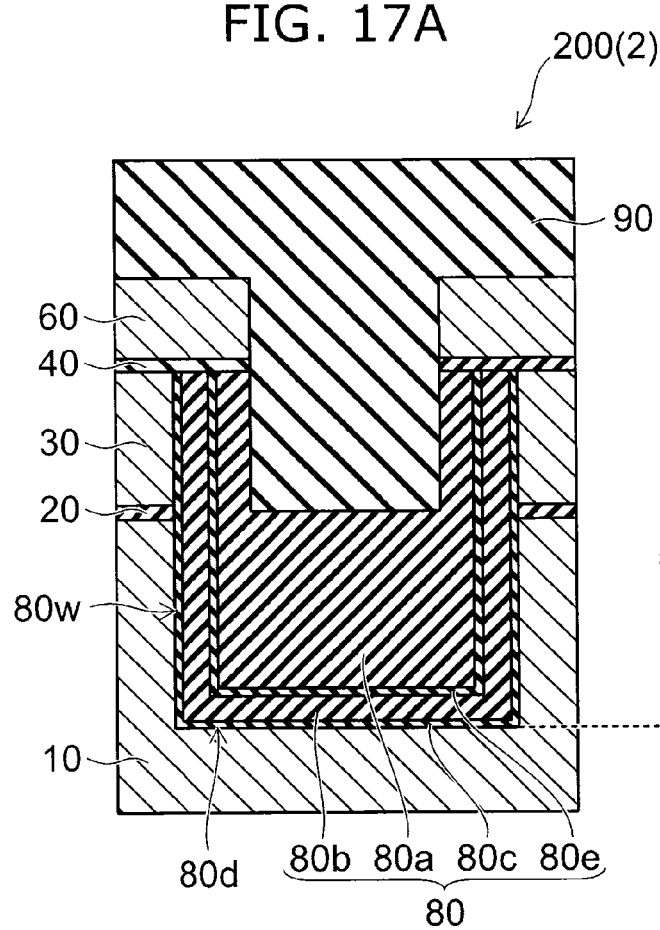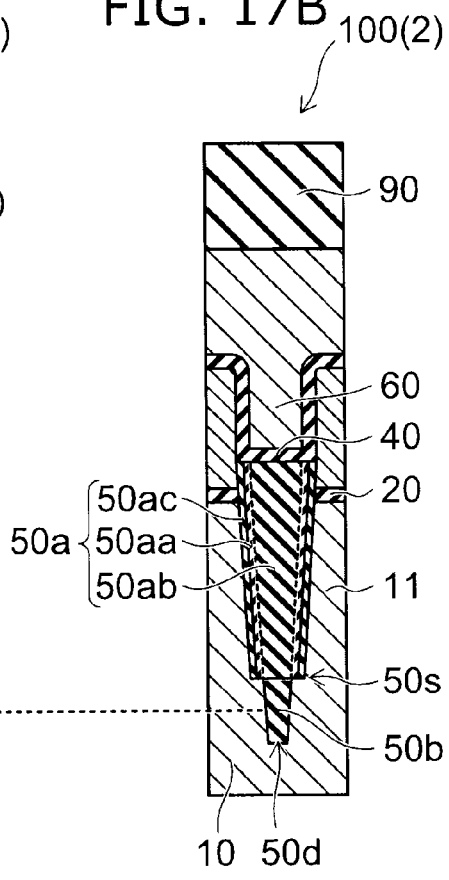

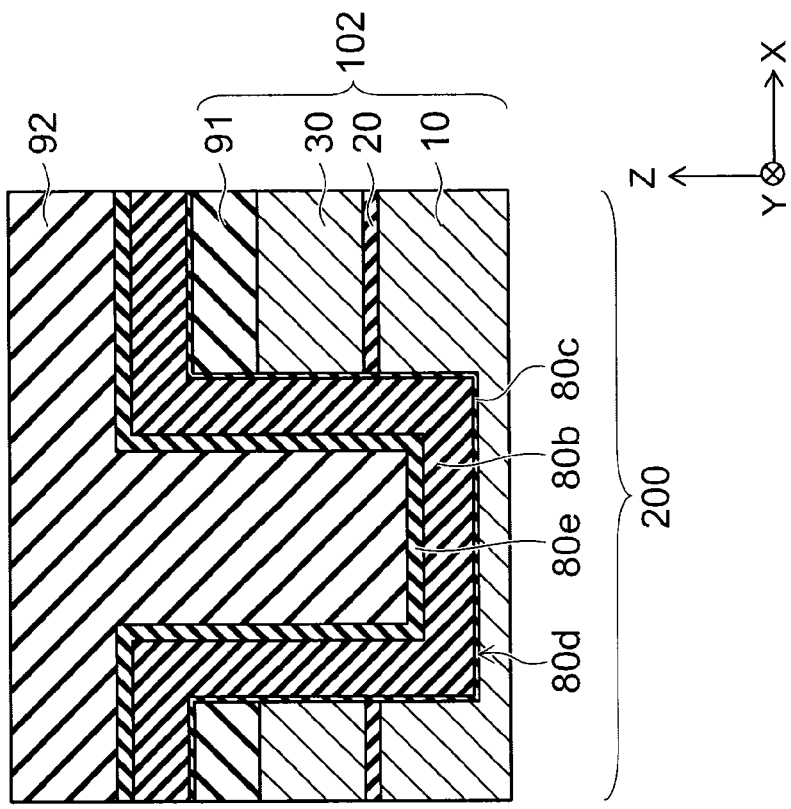
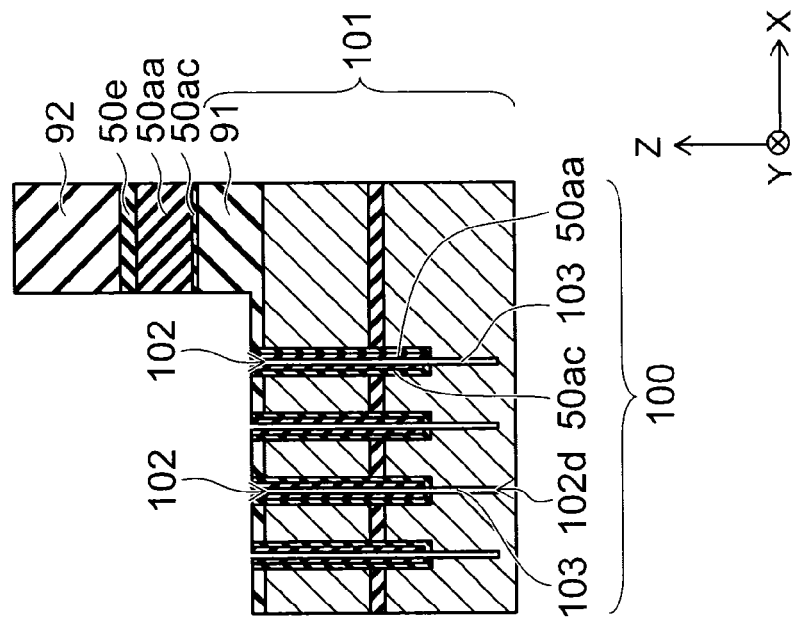

US 9,006,812 B2

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No. 2013-061135, filed on Mar. 22, 2013; the entire contents of which are incorporated herein by reference.

FIELD

Embodiments described herein relate generally to a nonvolatile semiconductor memory device and a method for manufacturing the same.

BACKGROUND

A nonvolatile semiconductor memory device typified by a NAND flash memory generally includes a memory cell region and a peripheral region provided outside the memory cell region on a semiconductor substrate. The memory cell region includes an element isolation region electrically insulating each element. Also in the peripheral region, an element isolation region defining an element or the like is provided.

For both element isolation regions, in general, the element isolation region in the memory cell region is formed shallow and the element isolation region in the peripheral region is formed deep due to the micro-loading effect. To suppress the current leak between cells in the memory cell region, the element isolation region in the memory cell region is deep preferably. However, as the element isolation region in the memory cell region is deeper, the volume of the element isolation region in the peripheral region becomes larger. Therefore, when an insulating film with large contraction stress or compressive stress is formed in the element isolation region in the peripheral region, the semiconductor substrate may receive stress from the element isolation region and a defect may occur in the semiconductor substrate. Consequently, the reliability of the nonvolatile semiconductor memory device may be reduced.

BRIEF DESCRIPTION OF THE DRAWINGS

FIG. 3A is an example of a schematic cross-sectional view showing a peripheral region of the nonvolatile semiconductor memory device according to the first embodiment; FIG. 3B is an example of a schematic cross-sectional view showing the memory cell region of the nonvolatile semiconductor memory device according to the first embodiment; and FIG. 3C is an example of a schematic plan view of a peripheral transistor in the peripheral region of the nonvolatile semiconductor memory device according to the first embodiment;

FIG. 4A to FIG. 14B are examples of schematic views showing a manufacturing process of the memory cell region according to the first embodiment;

FIG. 17A is an example of a schematic cross-sectional view showing a peripheral region of a nonvolatile semiconductor memory device according to a variation of the first embodiment; and FIG. 17B is an example of a schematic cross-sectional view showing a memory cell region of the nonvolatile semiconductor memory device according to the variation of the first embodiment; and FIG. 18A to FIG. 21B are examples of schematic cross-sectional views showing a manufacturing process of the nonvolatile semiconductor memory device according to the variation of the first embodiment.

DETAILED DESCRIPTION

Figure 1:
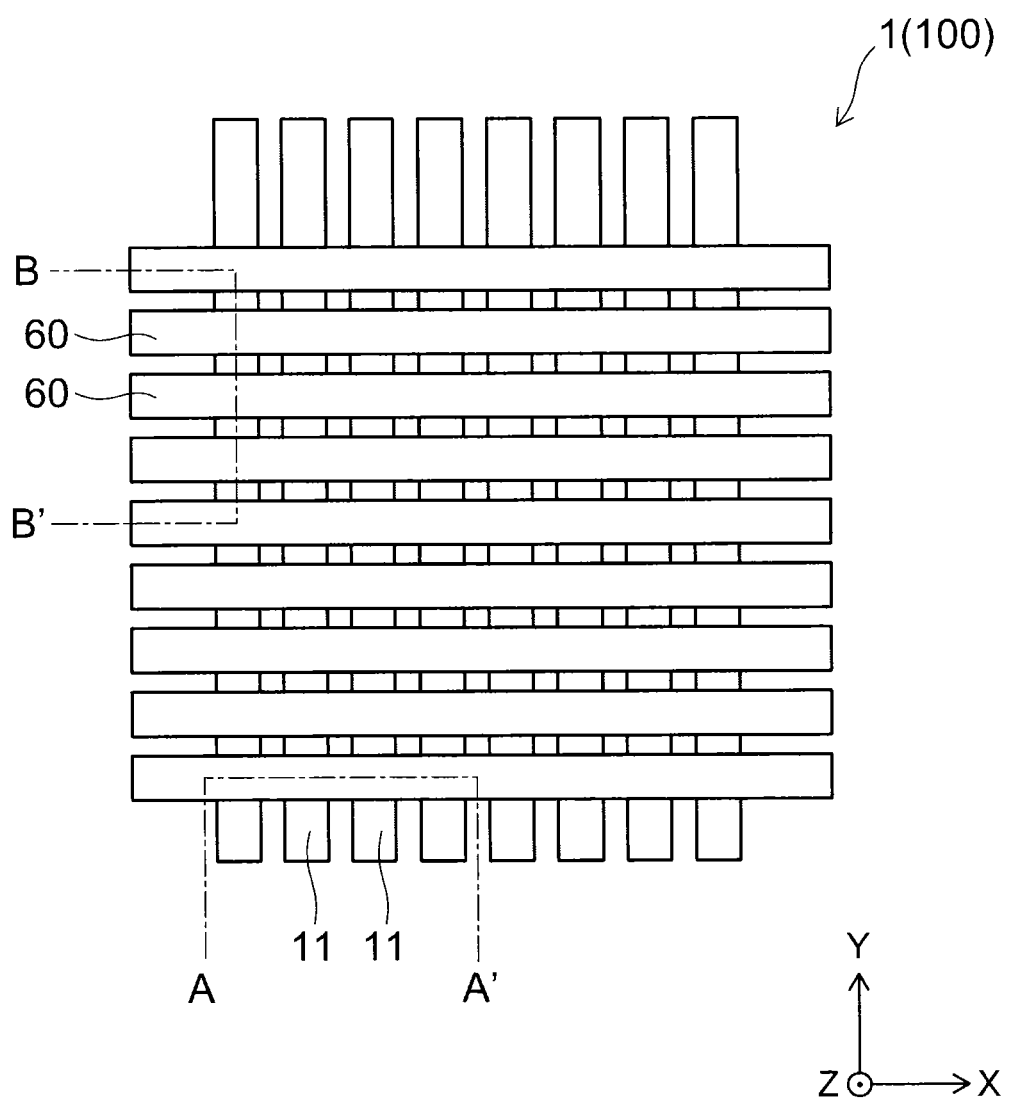
FIG. 1 is an example of a schematic plan view showing a memory cell region of a nonvolatile semiconductor memory device according to a first embodiment.

In general, according to one embodiment, a nonvolatile semiconductor memory device includes: a plurality of first element isolation regions separating a semiconductor layer in a second direction crossing a first direction, the first element isolation regions including a first insulating film; a plurality of first semiconductor regions separated by the first element isolation regions in the second direction and extending in the first direction; and a first gate insulating film, a charge storage layer, a second gate insulating film, and a control gate electrode provided on the first semiconductor regions, the peripheral region including: a second element isolation region separating the semiconductor layer into a plurality of second element regions and including a second insulating film. Each of the first element isolation regions includes a first portion and a second portion provided under the first portion, a step is disposed between the first portion and the second portion, at least part of a side surface and a lower end of the second element isolation region are surrounded by the semiconductor layer.

Various embodiments will be described hereinafter with reference to the accompanying drawings. In the following description, identical components are marked with the same reference numerals, and a description of components once described is omitted as appropriate.

First Embodiment

FIG. 1 is an example of a schematic plan view showing a memory cell region of a nonvolatile semiconductor memory device according to a first embodiment.

Figure 2A:
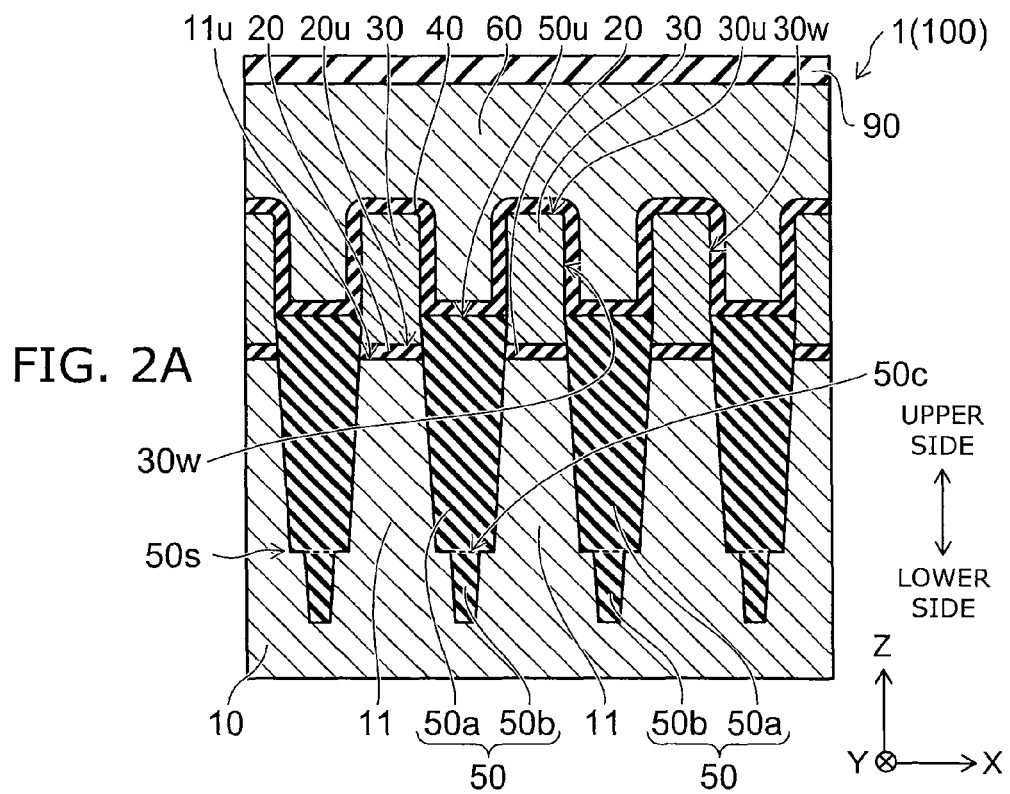
FIG. 2A and FIG. 2B are examples of schematic cross-sectional views showing the memory cell region of the nonvolatile semiconductor memory device according to the first embodiment.
Figure 2B:
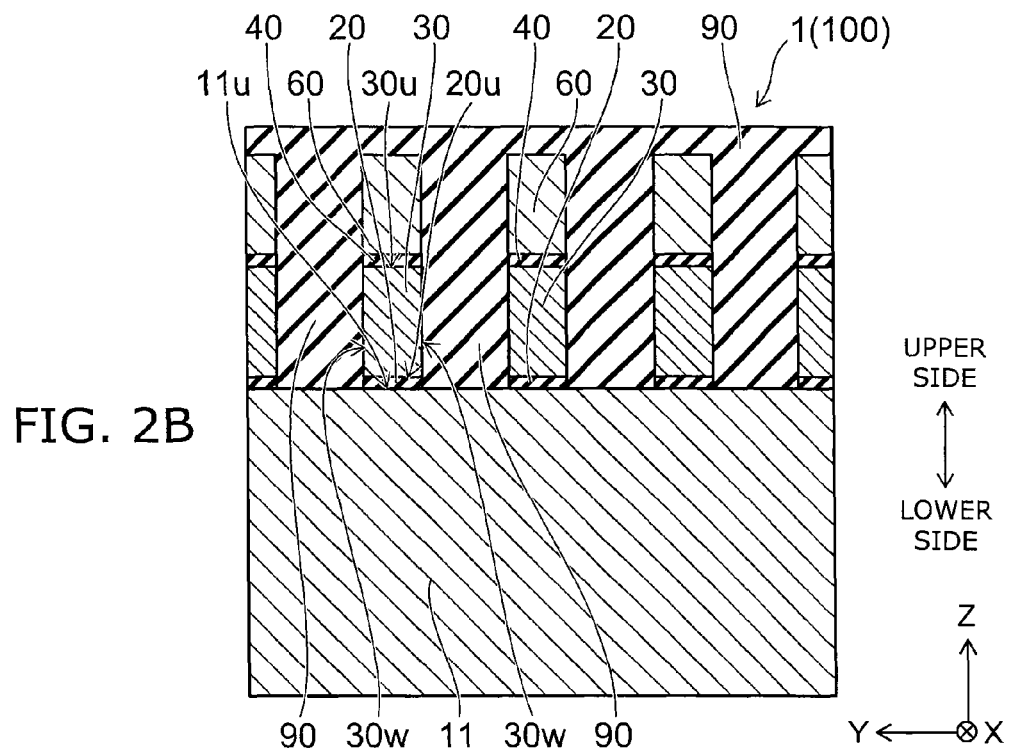

FIG. 2A and FIG. 2B are examples of schematic cross-sectional views showing the memory cell region of the nonvolatile semiconductor memory device according to the first embodiment. FIG. 2A shows a cross section in the position of line A-A' of FIG. 1, and FIG. 2B shows a cross section in the position of line B-B' of FIG. 1.

FIG. 3A is an example of a schematic cross-sectional view showing a peripheral region of the nonvolatile semiconductor memory device according to the first embodiment, FIG. 3B is an example of a schematic cross-sectional view showing the memory cell region of the nonvolatile semiconductor memory device according to the first embodiment, and FIG. 3C is an example of a schematic plan view of a peripheral transistor in the peripheral region of the nonvolatile semiconductor memory device according to the first embodiment.

A nonvolatile semiconductor memory device 1 according to the first embodiment includes a memory cell region 100 shown in FIG. 1, FIG. 2A, and FIG. 2B and a peripheral region 200 shown in FIG. 3. The peripheral region 200 is provided outside the memory cell region 100. The memory cell region 100 is, for example, a region in which information can be stored, and the peripheral region 200 is a region in which a logic circuit capable of controlling the reading and writing of memory cells etc. are provided.

First, the memory cell region 100 is described.

As shown in FIG. 1, the memory cell region 100 includes a plurality of semiconductor regions 11 (first semiconductor regions) and a plurality of control gate electrodes 60. The plurality of semiconductor regions 11 extend in the Y-direction (a first direction), and are arranged in a direction crossing the Y-direction, for example in a direction substantially perpendicular to the Y-direction (the X-direction). The plurality of control gate electrodes 60 extend in the X-direction (a second direction) different from the Y-direction, and are arranged in a direction crossing the X-direction, for example in a direction substantially perpendicular to the X-direction (the Y-direction). In the nonvolatile semiconductor memory device 1, each of the plurality of semiconductor regions 11 and each of the plurality of control gate electrodes 60 cross each other. The plurality of control gate electrodes 60 are provided on the plurality of semiconductor regions 11.

In the memory cell region 100, a transistor is disposed in a position where each of the plurality of semiconductor regions 11 and each of the plurality of control gate electrodes 60 cross each other (described later). The transistors are arranged two-dimensionally in the X-direction and the Y-direction. Each transistor functions as a memory cell of the nonvolatile semiconductor memory device 1.

Each of the plurality of semiconductor regions 11 forms part of a NAND string. Each of the plurality of semiconductor regions 11 is element-isolated. The control gate electrode 60 may be referred to as a word line.

As show in FIG. 2A and FIG. 2B, the memory cell region 100 includes a semiconductor layer 10, the semiconductor region 11, the control gate electrode 60, a charge storage layer 30, a gate insulating film 20 (a first gate insulating film), a gate insulating film 40 (a second gate insulating film), and an element isolation region 50 (a first element isolation region). The nonvolatile semiconductor memory device 1 includes a transistor including the semiconductor region 11, the gate insulating film 20, the charge storage layer 30, the gate insulating film 40, and the control gate electrode 60 in a position where the semiconductor region 11 and the control gate electrode 60 cross each other. The charge storage layer 30 may be an insulating film having a trap level or a stacked film of a conductive film and an insulating film having a trap level.

Each of the plurality of semiconductor regions 11 is provided on the semiconductor layer 10. Each of the plurality of semiconductor regions 11 is defined by the element isolation region 50 in the semiconductor layer 10. The upper portion of each of the plurality of semiconductor regions 11 may be doped with an impurity, and part of the transistor of the nonvolatile semiconductor memory device 1 functions as an active area.

The gate insulating film 20 is provided between the charge storage layer 30 and each of the plurality of semiconductor regions 11. The position of the upper surface 20u of the gate insulating film 20 is lower than the position of the upper surface 50u of the element isolation region 50. The gate insulating film 20 functions as a tunnel insulating film.

The charge storage layer 30 is provided in a position where each of the plurality of semiconductor regions 11 and each of the plurality of control gate electrodes 60 cross each other. The charge storage layer 30 covers the upper surface 20u of the gate insulating film 20. The charge storage layer 30 can store a charge that has tunneled from the semiconductor region 11 via the gate insulating film 20. The charge storage layer 30 may be referred to as a floating gate layer. The charge storage layer 30 has a substantially rectangular shape extending in the Z-direction in the A-A' cross section and the B-B' cross section shown in FIGS. 2A and 2B. Thus, the charge storage layer 30 extends in the Z-direction in a substantially prismatic shape.

The gate insulating film 40 is provided between the charge storage layer 30 and each of the plurality of control gate electrodes 60. The gate insulating film 40 covers the upper surface 30u of the charge storage layer 30. For example, in the Y-direction, the gate insulating film 40 covers the charge storage layer 30 other than the portion where the element isolation region 50 is in contact with the charge storage layer 30. In other words, in the Y-direction, the gate insulating film 40 covers part of the side surface 30w of the charge storage layer 30. In the Y-direction, the side surface 30w of the charge storage layer 30 is covered with an interlayer insulating film 70.

That is, the upper surface 30u and the side surface 30w of the charge storage layer 30 are covered with an insulator, and the charge stored in the charge storage layer 30 is prevented from leaking to the control gate electrode 60. The gate insulating film 40 may be referred to as a charge block layer.

The element isolation region 50 is provided between adjacent ones of the plurality of semiconductor regions 11. The element isolation region 50 is in contact with the gate insulating film 20 and the charge storage layer 30. The position of the upper surface 50u of the element isolation region 50 is lower than the position of the upper surface 30u of the charge storage layer 30. The position of the upper surface 11u of the semiconductor region 11 is lower than the position of the upper surface 50u of the element isolation region 50.

The element isolation region 50 has a first portion 50a (an insulating film 50a) and a second portion 50b (an insulating film 50b) provided under the first portion 50a. The width in the X-direction of the second portion 50b is narrower than the width in the X-direction of the first portion 50a. There is a step 50s between the first portion 50a and the second portion 50b. The first portion 50a of the element isolation region 50 has two portion of a first region 50aa located on the outside and a second region 50ab (an insulating film 50ab) located on the inside of the first region 50aa. The second portion 50b and the second region 50ab are formed of the same material. Here, the first region 50aa and the second region 50ab may be produced by separate processes. when the first region 50aa and the second region 50ab are formed of the same material, both may not be distinguished by TEM observation and the like in some cases.

The control gate electrode 60 covers part of the charge storage layer 30 via the gate insulating film 40. For example, in the Y-direction, the control gate electrode 60 coves the upper surface 30u and part of the side surface 30w of the charge storage layer 30 via the gate insulating film 40. In the X-direction, the control gate electrode 60 covers the upper surface 30u of the charge storage layer 30 via the gate insulating film 40. The control gate electrode 60 functions as a gate electrode for controlling the transistor. An interlayer insulating film (e, q, ref. 90 in FIG. 3A) is provided on the control gate electrode 60.

The peripheral region 200 will now be described.

FIG. 3C is a plan view of a peripheral transistor in the peripheral region 200. As shown in FIG. 3C, the semiconductor substrate 10 is separated into element regions 80A by an element isolation region 80. In each element region 80A, a gate electrode GD extends in the X-direction. The gate electrode GD extends from the element region 80A to the element isolation region 80. Here, a peripheral transistor PT is composed of one element region 80A and one gate electrode GD.

FIG. 3A is a cross-sectional view taken along line C-C' of FIG. 3C. The peripheral region 200 shown in FIG. 3A includes the semiconductor layer 10 and the element isolation region 80 (a second element isolation region). The element isolation region 80 has a first portion 80*a* (an insulating film 80*a*) and a second portion 80*b* (an insulating film 80*b*) surrounding the first portion 80*a*. In the element isolation region 80, at least part of the side 80*w* and the bottom (the lower surface) 80*d* of the element isolation region 80 are surrounded by the semiconductor layer 10.

The gate electrode GD includes the charge storage layer 30, an inter-electrode insulating film 40, and the control gate electrode 60. On the element isolation region 80, the gate electrode GD includes only the inter-electrode insulating film 40 and the control gate electrode 60. In the peripheral region 200, the gate insulating film 20 may be referred to as simply an insulating film 20, the charge storage layer 30 may be referred to as simply a conductive layer 30, and the gate insulating film 40 may be referred to as simply an insulating film 40.

Here, for comparison, a schematic cross-sectional view showing the memory cell region is shown juxtaposedly in FIG. 3B. Here, the step 50*s* in the element isolation region 50 shown in FIG. 3B is located shallower than the bottom 80*d* of the element isolation region 80. The lower end 50*d* of the element isolation region 50 is in the same position as the bottom 80*d* of the element isolation region 80 or in a position deeper than the bottom 80*d*. The width in the X-direction of the element isolation region 50 is narrower than the width in the X-direction of the element isolation region 80.

An interlayer insulating film 90 is provided on the element isolation region 80 and on the control gate electrode 60.

The material of the semiconductor layer 10 (or the semiconductor region 11) is, for example, an n-type semiconductor crystal. The material of the semiconductor region 11 is, for example, a p-type semiconductor crystal. As the semiconductor crystal, for example, a silicon (Si) crystal is given.

The material of the gate insulating film 20 is, for example, silicon oxide ($SiO_2$), silicon nitride ($Si_3N_4$), or the like. The gate insulating film 20 may be, for example, a single layer of a silicon oxide film or a silicon nitride film, or a film in which either a silicon oxide film or a silicon nitride film is stacked.

The material of the charge storage layer 30 is, for example, a semiconductor containing a p-type impurity, a metal, a metal compound, or the like. As the material of the charge storage layer 30, for example, amorphous silicon (a-Si), polysilicon (poly-Si), silicon germanium (SiGe), silicon nitride ($Si_xN_y$), hafnium oxide ($HfO_x$), and the like are given.

The gate insulating film 40 may be, for example, a single layer of a silicon oxide film or a silicon nitride film, or a film in which either a silicon oxide film or a silicon nitride film is stacked. For example, the gate insulating film 40 may be what is called an ONO film (silicon oxide film/silicon nitride film/silicon oxide film). The gate insulating film 40 may be also a metal oxide film or a metal nitride film.

The material of the element isolation regions 50 and 80 and the interlayer insulating films 70 and 90 is, for example, silicon oxide ($SiO_2$). In the embodiment, the portion written as an insulating layer or an insulating film contains, for example, silicon oxide ($SiO_2$), silicon nitride ($Si_3N_4$), or the like.

The material of the control gate electrode 60 is, for example, a semiconductor containing a p-type impurity. As the semiconductor, polysilicon is given. Alternatively, the material of the control gate electrode 60 may be, for example, a metal such as tungsten or a metal silicide.

As the p-type impurity element, for example, boron (B) is given. As the n-type impurity element, for example, phosphorus (P) and arsenic (As) are given.

Thus, the nonvolatile semiconductor device 1 includes a semiconductor layer having the memory cell region and the peripheral region. The memory cell region includes the first element isolation region that separates the semiconductor layer into a plurality of first semiconductor regions extending in the first direction and arranged in the second direction crossing the first direction and in which a first insulating film is embedded, the first gate insulating film provided on the plurality of first semiconductor regions, the charge storage layer, the second gate insulating film, and the control gate electrode. The peripheral region includes the second element isolation region that separates the semiconductor layer into a plurality of second element regions and in which a second insulating film is embedded. The plurality of first element isolation regions have the first portion and the second portion provided under the first portion, and a step is provided between the first portion and the second portion. At least part of the side surface and the lower surface of the second element isolation region are surrounded by the semiconductor layer.

The manufacturing process of the nonvolatile semiconductor memory device 1 will now described.

FIG. 4A to FIG. 10B are examples of schematic cross-sectional views showing the manufacturing process of the nonvolatile semiconductor memory device according to the first embodiment. The drawings of the numbers including "A" show the manufacturing process of the memory cell region 100, and the drawings of the numbers including "B" show the manufacturing process of the peripheral region 200.

Figure 4A:
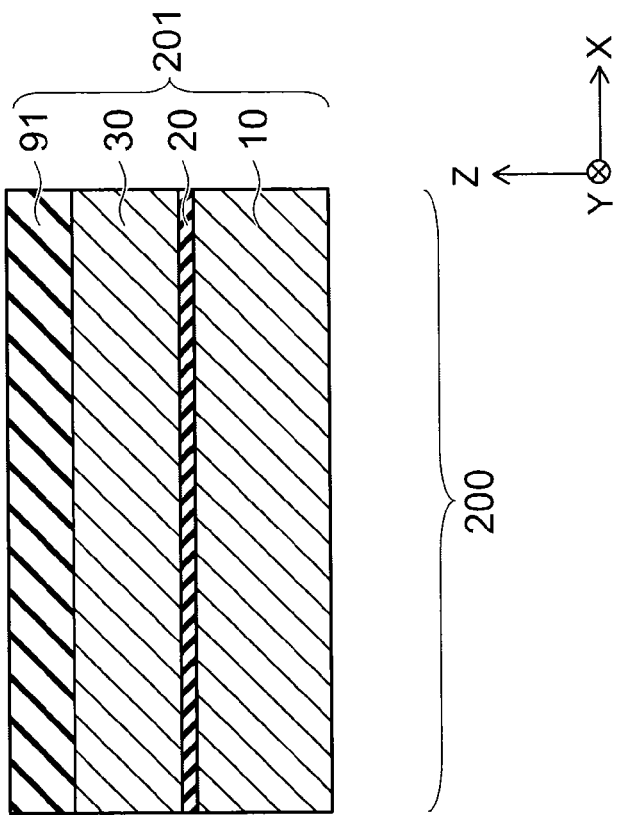
Figure 4B:
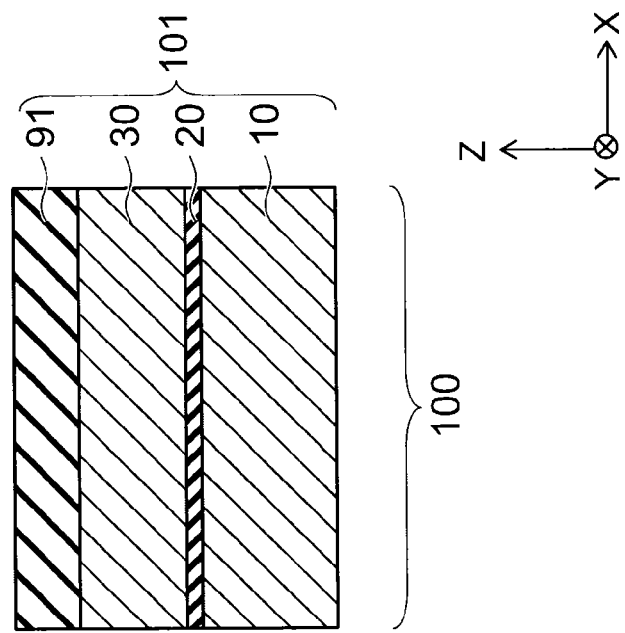

First, as shown in FIGS. 4A and 4B, in the memory cell region 100 and the peripheral region 200, a stacked body 101 including the semiconductor layer 10, the gate insulating film 20 provided on the semiconductor layer 10, and the charge storage layer 30 provided on the gate insulating film 20 is prepared. The stacked body 101 further includes an insulating film 91 provided on the charge storage layer 30. The insulating film 91 may be omitted as appropriate.

The gate insulating film 20 is formed by, for example, the thermal oxidation method. The thickness of the gate insulating film 20 is, for example, 10 nm (nanometers).

The charge storage layer 30 is doped with boron (B). The thickness of the charge storage layer 30 is, for example, 80 nm. The insulating film 91 is formed by, for example, the low pressure CVD method.

Next, as shown in FIG. 5A, in the memory cell region 100, etching processing is performed on the stacked body 101. For example, using photolithography technology and RIE (reactive ion etching) technology, a plurality of trenches 102 (first trenches) extending in the Y-direction are formed in the stacked body 101.

By the plurality of trenches 102 being formed, the stacked body 101 excluding part of the semiconductor layer 10 is divided in the X-direction. For example, the semiconductor region 11 sandwiched by adjacent ones of the plurality of trenches 102 is formed in the memory cell region 100.

As shown in FIG. 5B, in the peripheral region 200, a trench 202 (a second trench) is formed in a stacked body 201. The trench 202 is formed deeper than each of the plurality of trenches 102.

The width in the X-direction of the trench 202 is wider than the width in the X-direction of the trench 102. Here, it is due to what is called the micro-loading effect that the trench 202 is formed deeper than the trench 102 even when the trench 102 and the trench 202 are formed simultaneously.

Next, as shown in FIG. 6A, in the memory cell region 100, the insulating film 50aa is formed on the inner sidewall 102w and the bottom 102d of each of the plurality of trenches 102. The insulating film 50aa is formed also on the stacked body 101. As shown in FIG. 6B, in the peripheral region 200, the insulating film 80b is formed on the inner sidewall 202w and the bottom 202d of the trench 202. The insulating film 80b is formed also on the stacked body 201. The thickness of the insulating film 80b in the trench 202 is formed thicker than the thickness of the insulating film 50aa in the trench 102.

Here, the formations of the insulating films 50aa and 80b are performed simultaneously. the insulating films 50aa and 80b are the same material. The insulating films 50aa and 80b are formed by, for example, plasma CVD. The conditions of the plasma CVD are set to such conditions that the trench 102 is not completely filled with the insulating film 50aa.

In this case, first in the memory cell region 100, a thin insulating film 50aa is formed on the inner sidewall 102w and the bottom 102d of the trench 102. After that, the opening of the trench 102 is covered by the insulating film 50aa before the trench 102 is completely filled with the insulating film 50aa. Thus, the source gas of the insulating film 50aa does not flow into the trench 102. Consequently, the insulating film 50aa is formed on the plurality of trenches 102. On the other hand, in the trench 202, since the width in the X-direction of the trench 202 is wider than the width in the X-direction of the trench 102, the opening of the trench 202 is not covered by the insulating film 80b. Consequently, the insulating film 80b is formed along the side surface of the trench 202.

Specifically, the film formation time in which the insulating film 50aa is formed on the inner sidewall 102w and the bottom 102d of the trench 102 is denoted by T1. The film formation time from the opening of the trench 102 is covered by the insulating film 50aa to the insulating film 50aa is formed on the plurality of trenches 102 is denoted by T2.

On the other hand, in the peripheral region 200, since the width of the trench 202 is wider than the width of the trench 102, the opening of the trench 202 is not covered by the insulating film 80b. The film formation time of the insulating film 80b is T1+T2. Therefore, the thickness of the insulating film 80b on the side surface of the trench 202 is thicker than the thickness of the insulating film 50aa on the side surface of the trench 102.

Next, as shown in FIG. 7A, in the memory cell region 100, a resist layer 92 is patterned on the insulating film 50aa other than the cell portion 100c of the memory cell region 100. The patterning of the resist layer 92 is performed by photolithography and etching. As shown in FIG. 7B, in the peripheral region 200, the resist layer 92 is formed on the insulating film 80b.

Next, as shown in FIG. 8A, in the cell portion 100c of the memory cell region 100, the insulating film 50aa opened from the resist layer 92 is removed by, for example, the RIE method. As a result, the insulating film 50aa that has covered the opening of the trench 102 is removed. That is, the top of the trench 102 is opened again.

After that, RIE is further performed, and part of the insulating film 50aa provided on the bottom 102d of the trench 102 is removed. Subsequently, the etching conditions of the RIE method are switched to conditions where the etching rate of silicon is higher than the etching rate of the insulating film 50aa (a silicon oxide film), and etching is performed. As a result, part of the semiconductor layer 10 under each of the plurality of trenches 102 is removed. Thereby, a trench 103 (a third trench) is formed in the semiconductor layer 10 under the trench 102. In other words, in the semiconductor layer 10, the insulating film 50aa provided on the inner sidewall 102w of the trench 102 is used as a mask to form the third trench from the bottom surfaces of the plurality of first trenches, and the position of the bottom surface of the second trench is kept.

In the formation of the trench 103, since the insulating film 50aa provided on the inner sidewall 102w of the trench 102 serves as a mask, a step is formed between the trench 102 and the trench 103. Thus, the width in the X-direction of the trench 103 is narrower than the width in the X-direction of the trench 102. The bottom 103d of the trench 103 is adjusted so as to be deeper than the bottom 202d of the trench 202.

In this stage, each of the plurality of semiconductor regions 11 has been divided by the trenches 102 and 103.

As shown in FIG. 8B, since the peripheral region 200 is covered with the resist layer 92, the peripheral region 200 is not influenced by the etching. Therefore, in the peripheral region 200, the structure under the resist layer 92 keeps the same state as FIG. 7B.

After that, the resist layer 92 is removed from the memory cell region 100 and the peripheral region 200.

Figure 9A:
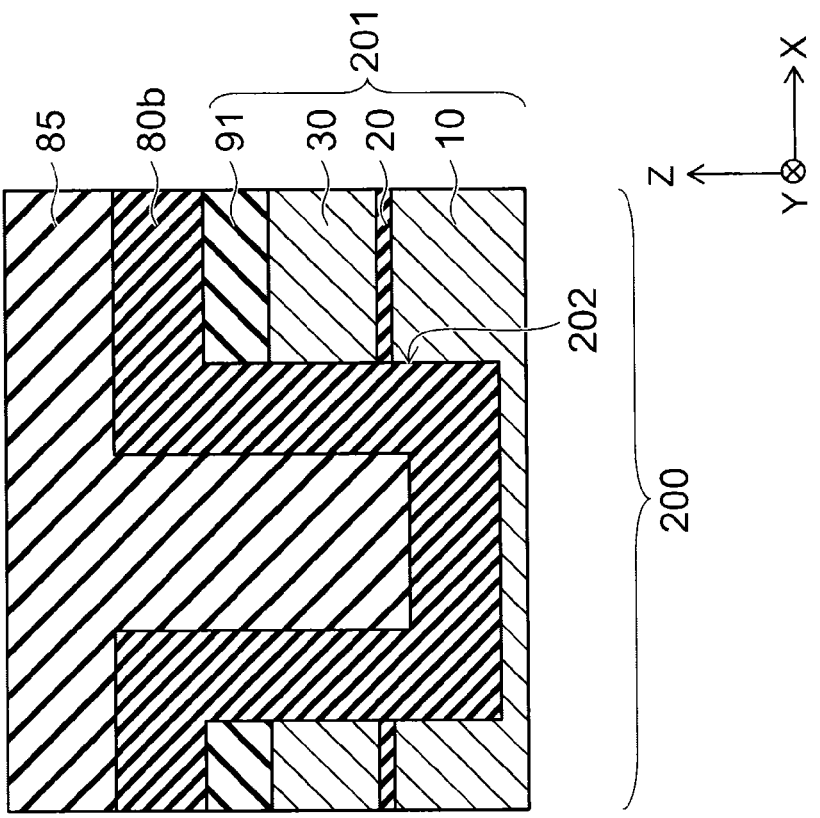
Figure 9B:
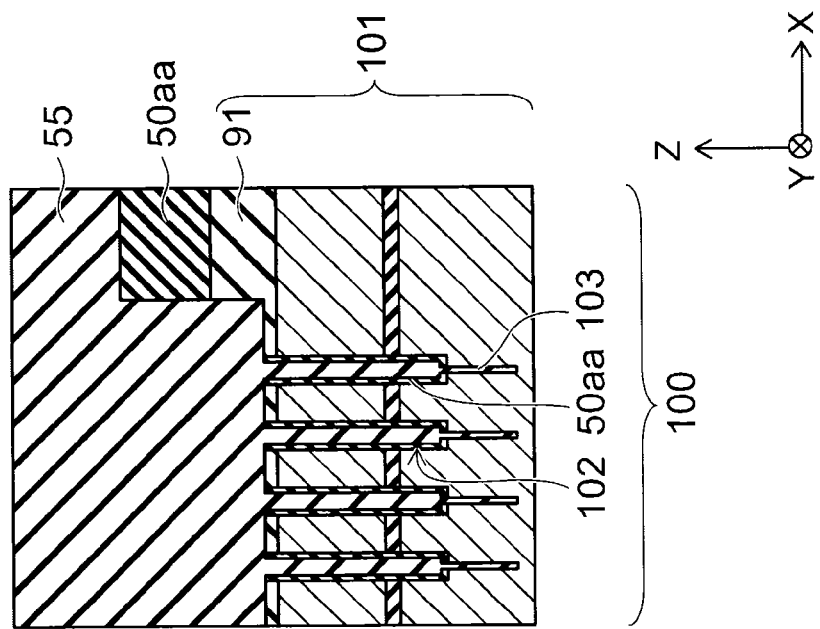

Next, as shown in FIG. 9A, in the memory cell region 100, an insulating layer 55 is formed in the trench 103, in the trench 102, and on the stacked body 101. As shown in FIG. 9B, in the peripheral region 200, an insulating layer 85 is formed in the trench 202 and on the stacked body 201. Here, the insulating layers 55 and 85 are formed simultaneously. The insulating layers 55 and 85 are the same material.

The insulating layers 55 and 85 are formed by, for example, the application method. The insulating layers 55 and 85 are SOG (spin on glass) films. The thickness of the insulating layers 55 and 85 is 500 nm or more. After the insulating layers 55 and 85 are applied, heating treatment is performed on the insulating layers 55 and 85 in order to enhance the crystallinity of the insulating layers 55 and 85. For example, the linear contraction coefficient of the insulating layers 55 and 85 is larger than the linear contraction coefficient of the semiconductor layer 10. the linear contraction coefficient may be different at least between the insulating layers 55 and 85 and the semiconductor layer 10. The linear contraction coefficient of the insulating film 55 is larger than the linear contraction coefficient of the insulating film 50aa.

Next, the insulating films 50aa and 80b and the insulating layers 55 and 85 are removed by, for example, CMP (chemical mechanical polishing) using the insulating film 91 as a stopper. After that, the upper surfaces of the insulating films 50aa and 80b and the insulating films 55 and 85 are etched to the upper surface of the charge storage layer 30 by, for example, the RIE method. After that, the insulating film 91 is removed. This state is shown in FIG. 10A and FIG. 10B.

As shown in FIG. 10A, the element isolation region 50 is formed in the memory cell region 100. The element isolation region 50 includes the insulating film 50a (the insulating film 50aa and the insulating film 50ab) and the insulating film 50b. The insulating film 80a and the insulating film 50b are the same material as the insulating film 55.

As shown in FIG. 10B, the element isolation region 80 is formed in the peripheral region 200. The element isolation region 80 includes the insulating film 80a and the insulating film 80b.

After that, in the memory cell region 100, process processing is further performed. The manufacturing process of the memory cell region 100 is described below.

FIG. 11A to FIG. 14B are examples of schematic views showing the manufacturing process of the memory cell region according to the first embodiment. Here, the drawings of the numbers including "A" show schematic cross-sectional views of the memory cell region, and the drawings of the numbers including "B" show schematic plan views of the memory cell region.

Figure 11A:
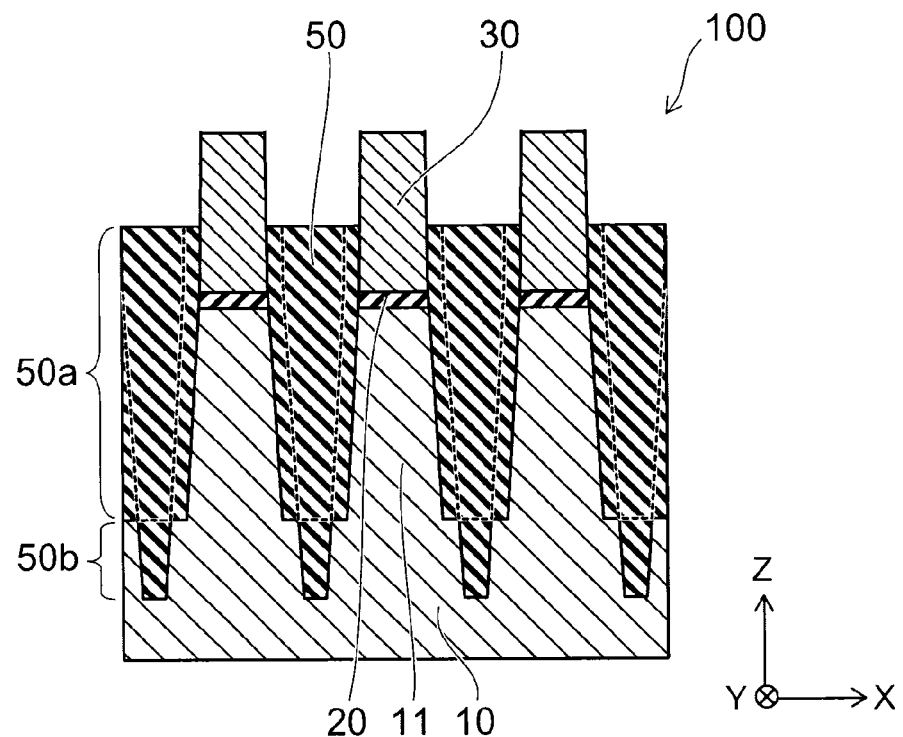
Figure 11B:
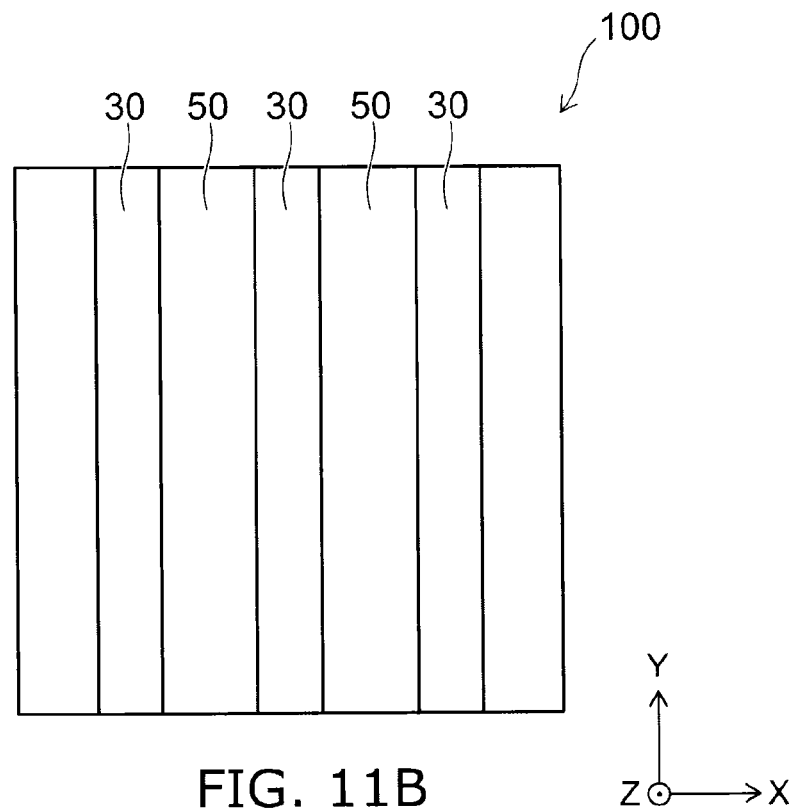

As shown in FIG. 11A and FIG. 11B, the element isolation region 50 is etched back. Thereby, part of the side surface 30w of the charge storage layer 30 is exposed. At this time, the entire surface of the peripheral region 200 is covered with a resist or the like. As a result, the upper portion of the insulating film 80 in the peripheral region 200 is not etched back.

Figure 12A:
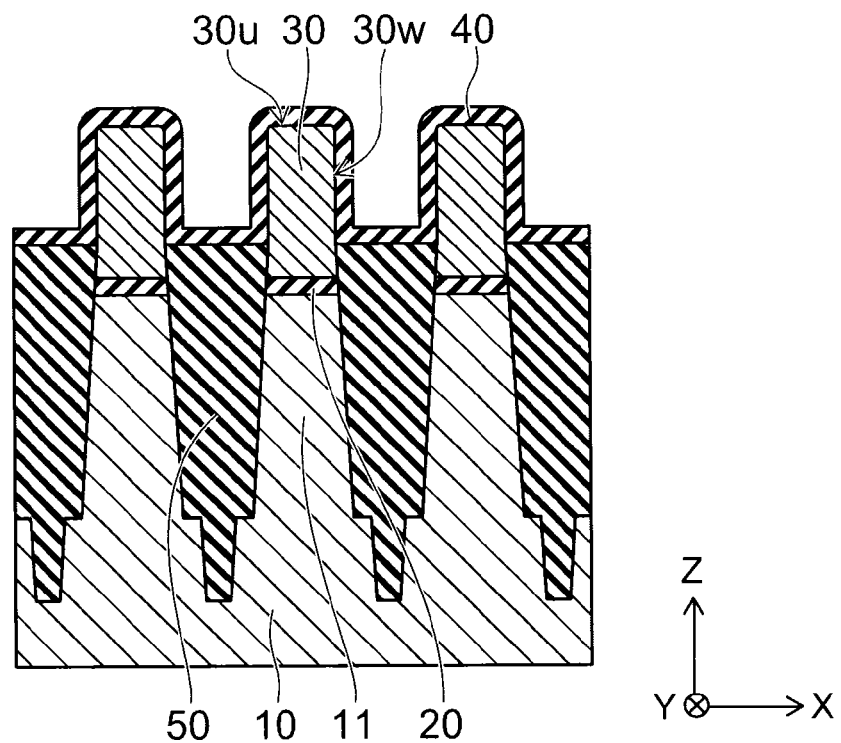
Figure 12B:
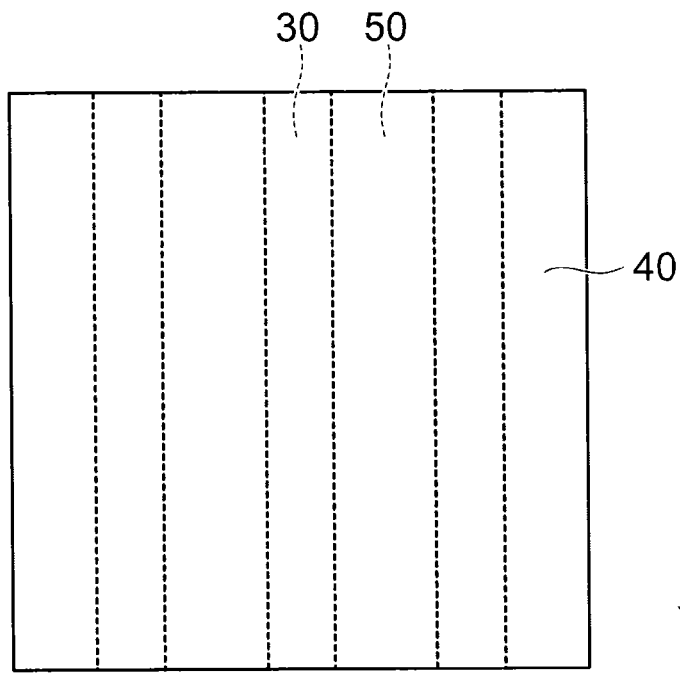

Next, as shown in FIG. 12A and FIG. 12B, the gate insulating film 40 is formed on the surface of the charge storage layer 30 exposed from the element isolation region 50 and on the element isolation region 50. Thus, the upper side of the element isolation region 50 and the charge storage layer 30 above the element isolation region 50 are covered by the gate insulating film 40. In the peripheral region 200, the resist or the like is peeled off, and the peripheral region 200 is covered by the gate insulating film 40 similarly to the memory cell region 100. At this time, since the upper surfaces of the element isolation region 80 and the charge storage layer 30 almost coincide, the gate insulating film 40 is formed almost flat on the upper surfaces from the element isolation region 80 to the charge storage layer 30.

Figure 13A:
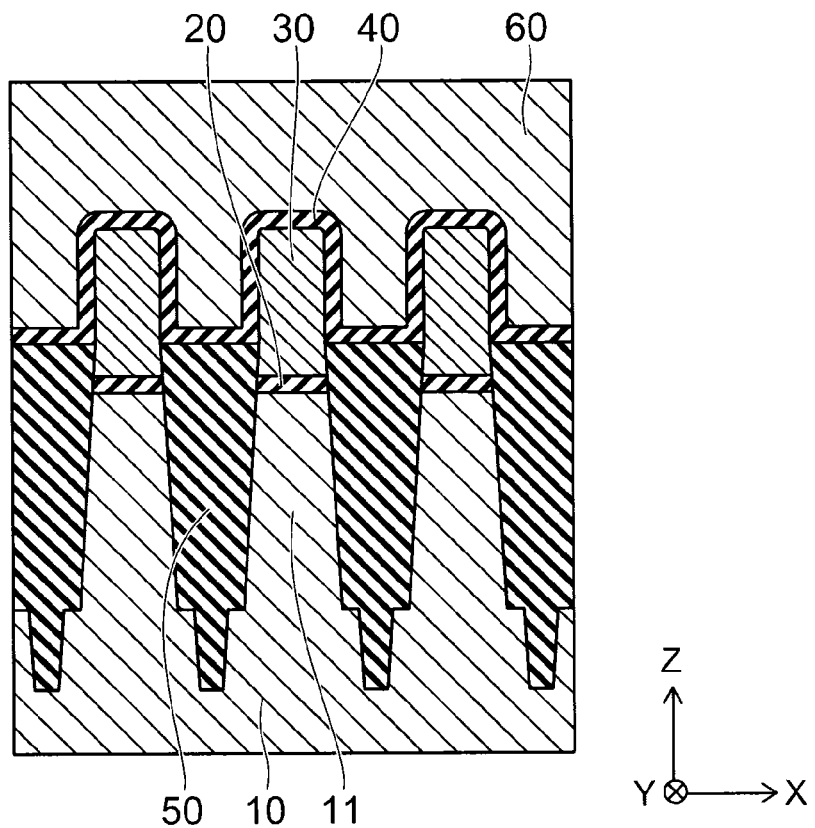
Figure 13B:
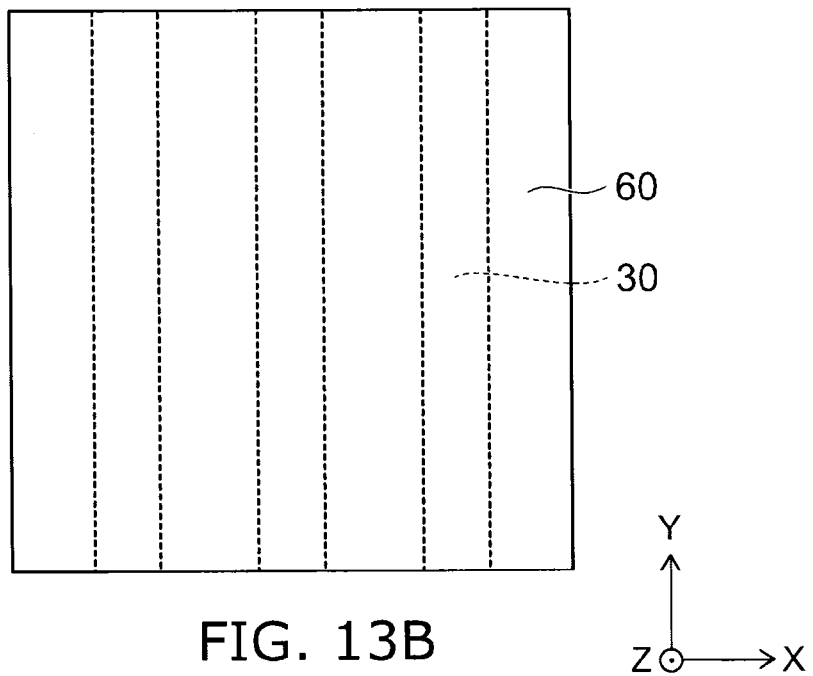

Next, as shown in FIG. 13A and FIG. 13B, the control gate electrode 60 is formed on the gate insulating film 40. Also in the peripheral region 200, the control gate electrode 60 is formed on the gate insulating film 40. In the portion of the gate electrode GD in the peripheral region 200, part of the gate insulating film 40 is removed, and the charge storage layer 30 and the control gate electrode 60 are electrically connected.

Next, as shown in FIG. 14A and FIG. 14B, photolithography and etching are performed to divide the control gate electrode 60, the gate insulating film 40, and the charge storage layer 30 in the Y-direction. Thereby, a plurality of control gate electrodes 60 extending in the X-direction are formed.

After that, the interlayer insulating film 70 is formed between adjacent ones of the plurality of control gate electrodes 60 (see FIG. 2B). Also in the peripheral region 200, the control gate electrode 60, the gate insulating film 40, and the charge storage layer 30 are similarly processed to form the gate electrode GD. By such a manufacturing process, the nonvolatile semiconductor memory device 1 is formed.

Before effects of the first embodiment are described, the manufacturing process of a nonvolatile semiconductor memory device according to a reference example is described.

FIG. 15A to FIG. 16B are examples of schematic cross-sectional views showing the manufacturing process of a nonvolatile semiconductor memory device according to a reference example. The drawings of the numbers including "A" show the manufacturing process of the memory cell region 100, and the drawings of the numbers including "B" show the manufacturing process of the peripheral region 200.

Figure 15A:
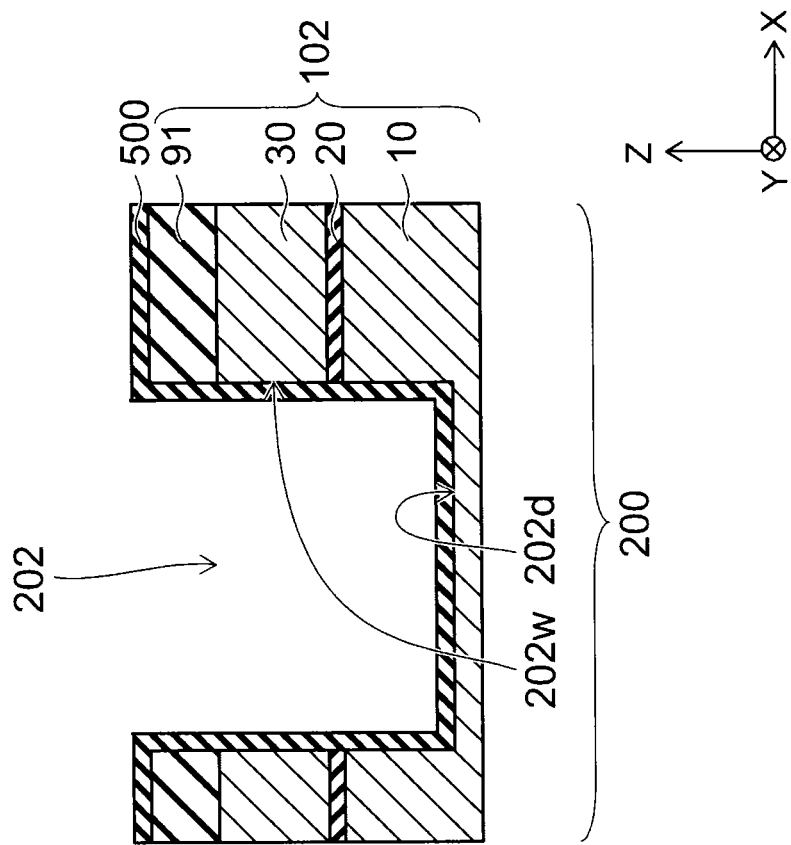
FIG. 15A to FIG. 16B are examples of schematic cross-sectional views showing a manufacturing process of a nonvolatile semiconductor memory device according to a reference example.
Figure 15B:
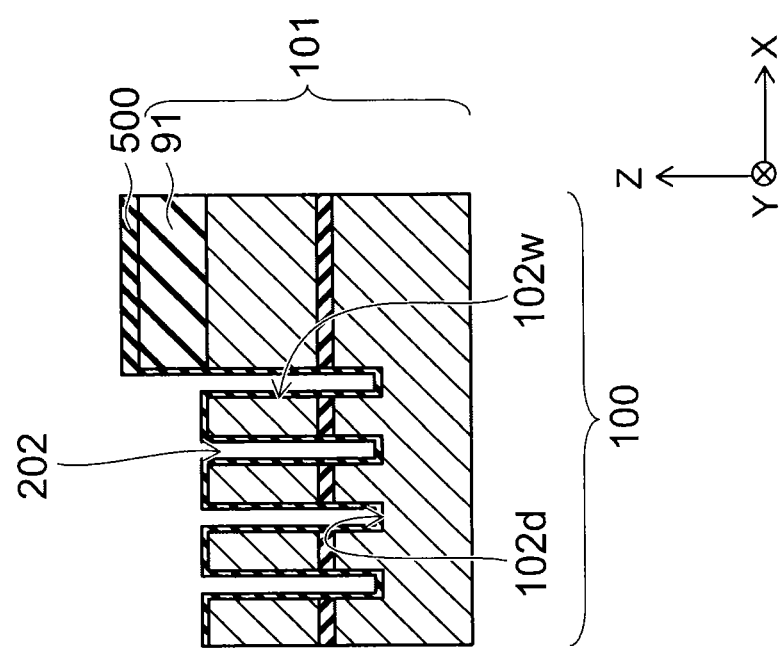

First, after the state shown in FIG. 5A and FIG. 5B is obtained, an insulating film 500 is formed on the inner sidewall 102w and the bottom 102d of each of the plurality of trenches 102. The insulating film 500 is formed also on the inner sidewall 202w and the bottom 202d of the trench 202. This state is shown in FIG. 15A and FIG. 15B.

In the reference example, the insulating film 500 is formed under the process condition of higher step coatability than the plasma CVD method described above. For example, the low pressure CVD method is given as the method. Consequently, in the memory cell region 100, the opening of the trench 102 is not covered by the insulating film 500, and the insulating film 500 is formed on the inner sidewall 102w and the bottom 102d of the trench 102. Also in the peripheral region 200, the insulating film 500 is formed on the inner sidewall 202w and the bottom 202d of the trench 202.

The film formation is finished when the insulating film 500 is not completely formed in the trench 102 and the insulating film 500 with a prescribed thickness is formed on the inner sidewall 102w and the bottom 102d of the trench 102. Thus, the thickness of the insulating film 500 in the peripheral region 200 is thinner than the thickness of the insulating film 80b described above.

Figure 16B:
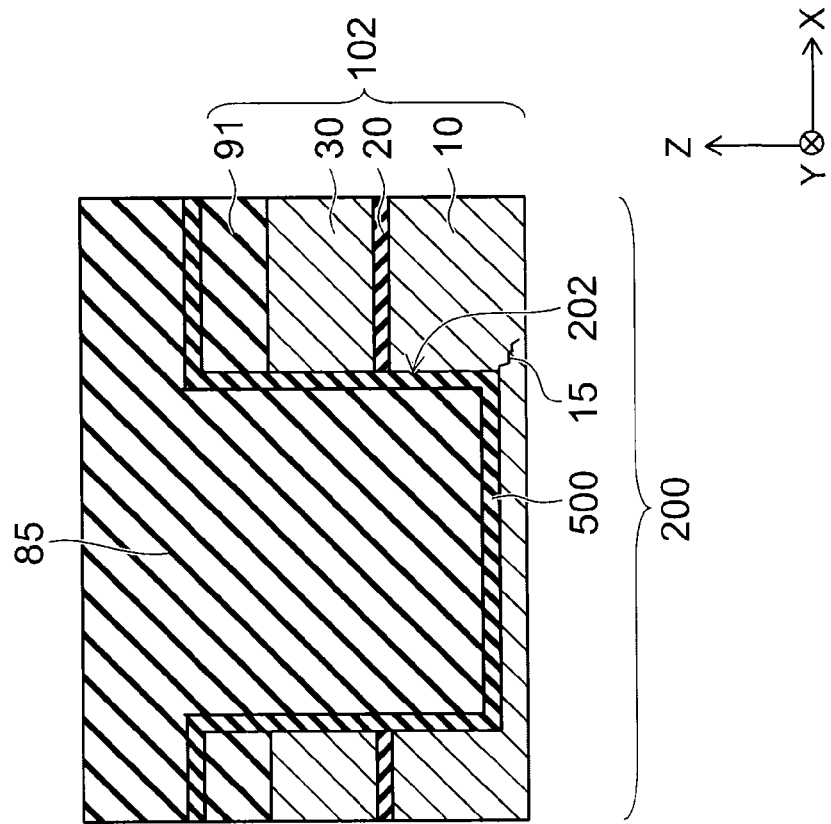
Figure 16A:
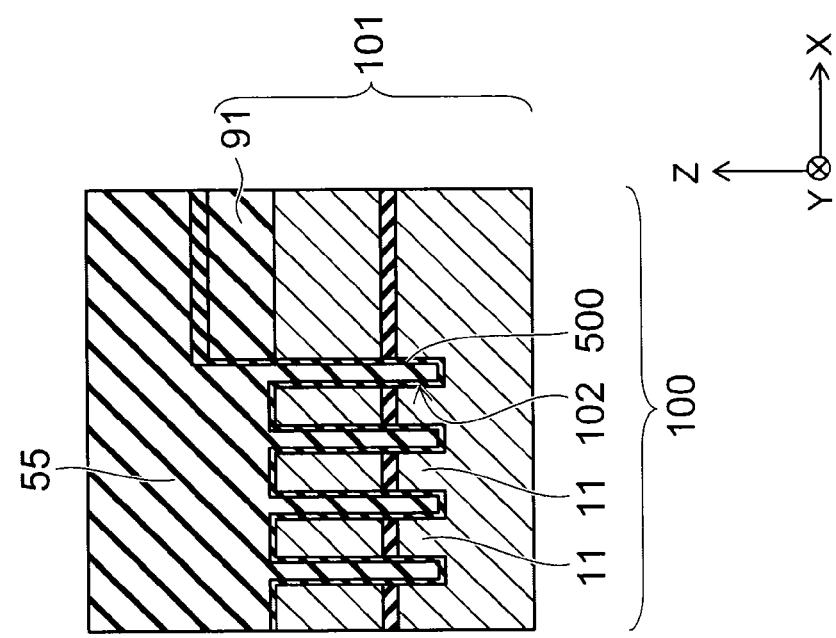

Next, as shown in FIG. 16A, in the memory cell region 100, the insulating layer 55 is formed in the trench 102 and on the stacked body 101. As shown in FIG. 16B, in the peripheral region 200, the insulating layer 85 is formed in the trench 202 and on the stacked body 201.

To suppress the current leak between adjacent semiconductor regions 11, the depth in the Z-direction of the trench 102 is preferably formed as deep as possible. The depth in the Z-direction of the trench 202 is deeper than the depth in the Z-direction of the trench 102 due to the micro-loading effect. Accordingly, as the depth in the Z-direction of the trench 102 becomes deeper, the volume of the trench 202 becomes larger.

The insulating layer 85 is formed in the trench 202. Thus, as the volume of the trench 202 increases, the stress applied to the semiconductor layer 10 increases. This is because the linear contraction coefficient of the insulating layer 85 is larger than the linear contraction coefficient of the semiconductor layer 10. For example, the insulating layer 85 contracts due to the heating treatment described above and the subsequent cooling, and a certain stress occurs in the semiconductor layer 10. If the stress exceeds the allowable value, a crystal defect 15 may occur in the semiconductor layer 10.

As a method for preventing the occurrence of the crystal defect 15, there is a method that reduces the volume of the trench 202. Thereby, the stress described above is reduced. However, when the volume of the trench 202 is controlled to a low level, the depth of the trench 102 will be shallow, and the depth of the element isolation region 50 formed in the trench 102 will be shallow. Consequently, a current leak may occur between adjacent semiconductor regions 11.

The trade-off connection between crystal defect occurrence and current leak occurrence becomes more significant as the shrinking of the nonvolatile semiconductor memory device. This is because the difference in depth between the trench 102 and the trench 202 becomes larger due to the micro-loading effect as the shrinking of the nonvolatile semiconductor memory device. In other words, as the shrinking of the nonvolatile semiconductor memory device, it becomes more difficult to achieve both the crystal defect prevention in the peripheral region and the current leak prevention in the memory cell region 100.

In contrast, in the first embodiment, the insulating film 80b thicker than the insulating film 500 is formed in the trench 202 beforehand, and then the insulating layer 85 is formed on the insulating film 80b. Therefore, the occupancy of the insulating layer 85 in the trench 202 is decreased, and the stress applied to the semiconductor layer 10 is reduced. Furthermore, the thick insulating film 80b functions as a stress relaxation layer. Thereby, a crystal defect 15 is less likely to occur in the semiconductor layer 10.

In the first embodiment, the trench 102 is formed in the semiconductor layer 10, and further the trench 103 is formed in the semiconductor layer 10 under the trench 102. The element isolation region 50 is provided in the trench 102 and the trench 103.

That is, in the first embodiment, the depth of the trench 103 can be controlled independently of the depth of the trench 202. Thus, the depth of the element isolation region 50 is prevented from being shallow, and a current leak is less likely to occur between adjacent semiconductor regions 11.

In the first embodiment, the element isolation region 50 includes, in addition to the first portion 50a, the second portion 50b provided under the first portion 50a. Thereby, in the nonvolatile semiconductor memory device 1, the length in the Z-direction of the element isolation region is still longer than that in the reference example. Consequently, in the nonvolatile semiconductor memory device 1, the electrical insulation between adjacent ones of the plurality of semiconductor regions 11 is further improved. As a consequence, a punch-through current (e) is less likely to flow between adjacent ones of the plurality of semiconductor regions 11.

That is, by the first embodiment, both the crystal defect prevention in the peripheral region and the current leak prevention in the memory cell region 100 are achieved. Consequently, a highly reliable nonvolatile semiconductor memory device is obtained.

The width in the X-direction of the semiconductor layer 10 sandwiched by adjacent trenches 103 is wider than the width in the X-direction of the semiconductor layer 10 sandwiched by adjacent trenches 102 (see FIG. 8A). Thus, each semiconductor region 11 is in a substantially convex shape. Consequently, the lower portion of the semiconductor region 11 is thicker than the upper portion in the X-direction. Thereby, in the memory cell region 100, pattern collapse or destruction is less likely to occur in the state shown in FIG. 8A.

(A Variation of the First Embodiment)

A nonvolatile semiconductor memory device according to a variation of the first embodiment will now be described.

FIG. 17A is an example of a schematic cross-sectional view showing a peripheral region of a nonvolatile semiconductor memory device according to a variation of the first embodiment, and FIG. 17B is an example of a schematic cross-sectional view showing a memory cell region of the nonvolatile semiconductor memory device according to the variation of the first embodiment.

In a nonvolatile semiconductor memory device 2 according to the variation of the first embodiment, the structures of the element isolation regions 50 and 80 are different from the structures of the element isolation regions 50 and 80 of the nonvolatile semiconductor memory device 1.

As shown in FIG. 17A, the peripheral region 200 includes an insulating film 80c formed on the side surface 80w of the semiconductor layer 10, the insulating film 80b formed on the side surface of the insulating film 80c, and an insulating film 80e formed on the side surface of the insulating film 80b. Here, the insulating film 80e has a recess, and the insulating film 80a is formed so as to fill the recess.

As shown in FIG. 17B, in the element isolation region 50, an insulating film 50ac formed on the side surface 80w above the step 50s of the semiconductor layer 10, the insulating film 50aa formed on the side surface of the insulating film 50ac, and the insulating film 50ab formed in the recess of the insulating film 50aa are formed. The insulating film 50b is formed in a trench below the step 50s.

In a manufacturing process described later, the insulating film 80a and the insulating films 50ab and 50b are formed in the same process. Therefore, the insulating film 80a and the insulating films 50ab and 50b are formed of the same material, and may be referred to as a first insulating film. The insulating film 80b and the insulating film 50aa are formed in the same process, and are formed of the same material. Thus, the insulating film 80b and the insulating film 50aa may be referred to as a second insulating film. The insulating film 80e may be referred to as a third insulating film.

FIG. 18A to FIG. 21B are examples of schematic cross-sectional views showing the manufacturing process of the nonvolatile semiconductor memory device according to the variation of the first embodiment. The drawings of the numbers including "A" show the manufacturing process of the memory cell region 100, and the drawings of the numbers including "B" show the manufacturing process of the peripheral region 200.

Figure 18B:
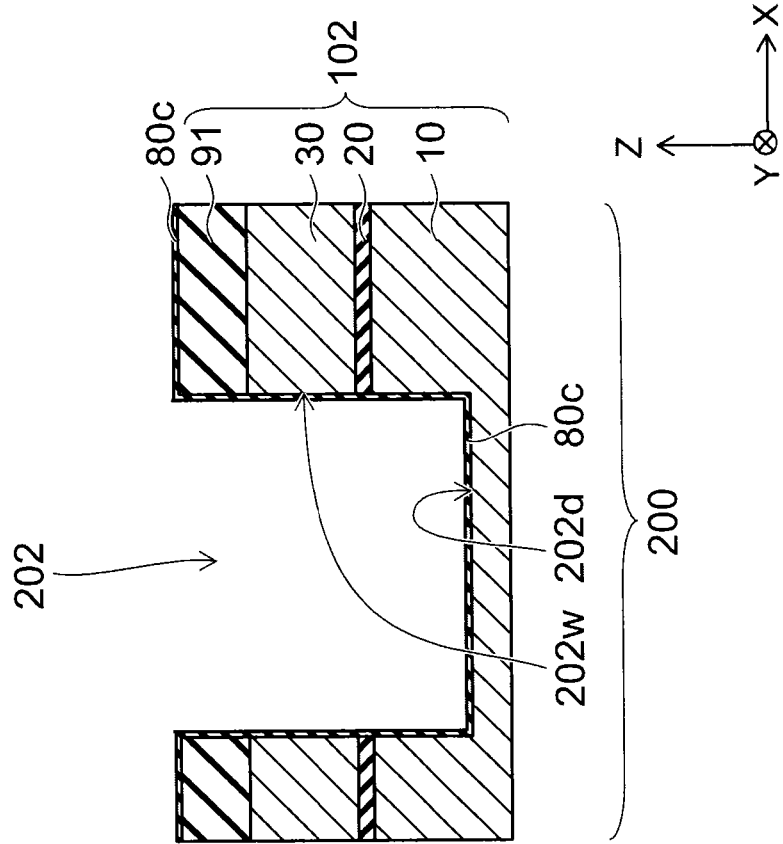
Figure 18A:
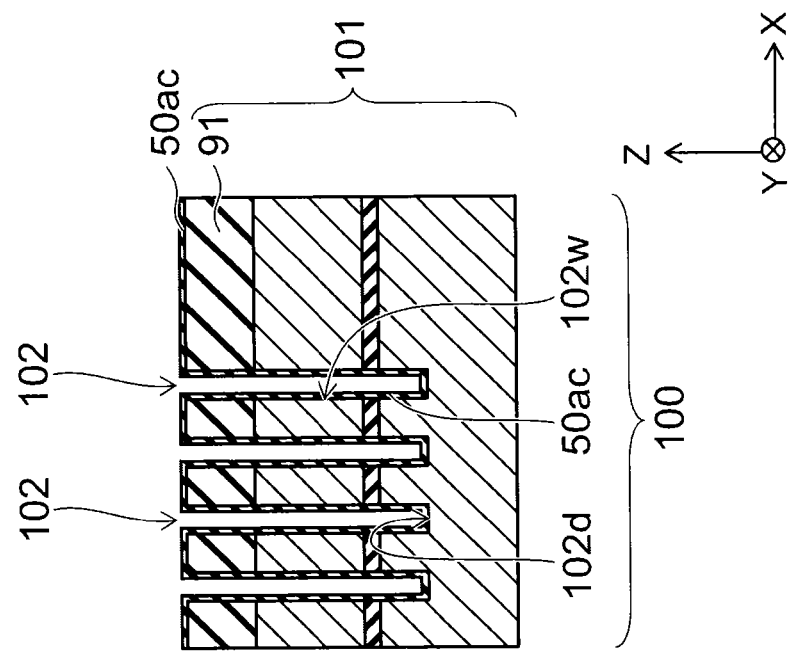

First, after the state shown in FIG. 5A and FIG. 5B is obtained, the insulating film 50ac is formed on the inner sidewall 102w and the bottom 102d of each of the plurality of trenches 102. The insulating film 80c is formed on the inner sidewall 202w and the bottom 202d of the trench 202. This state is shown in FIG. 18A and FIG. 18B. The insulating film 50ac and the insulating film 80c are formed simultaneously by, for example, the low pressure CVD method. Here, the materials of the insulating film 50a and the insulating film 80c are the same. The film thicknesses of the insulating film 50ac in the trench 102 and the insulating film 80c in the trench 202 are almost the same.

Figure 19B:
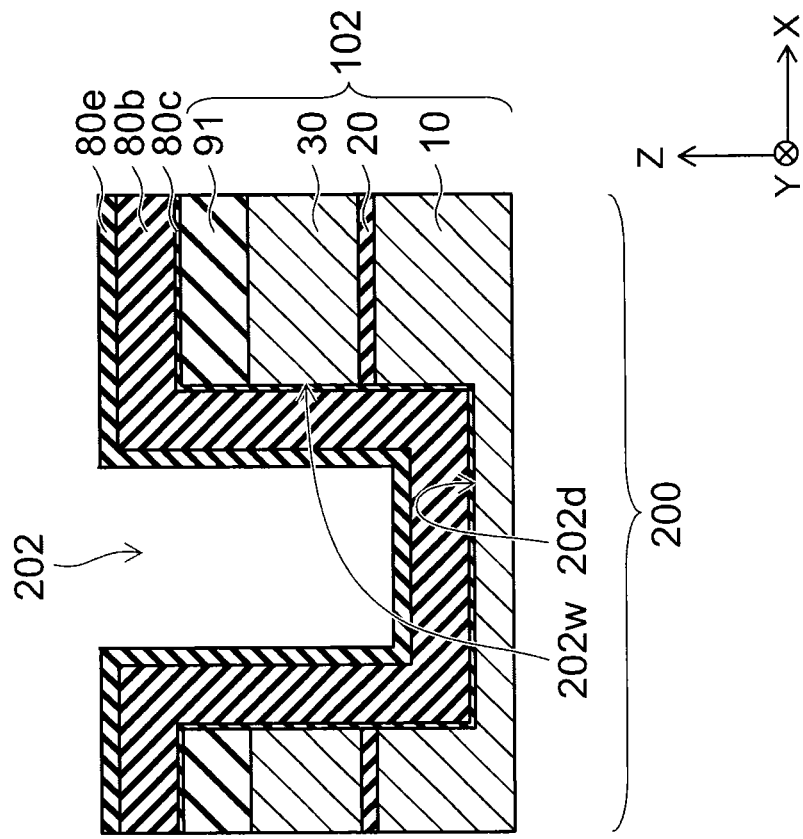
Figure 19A:
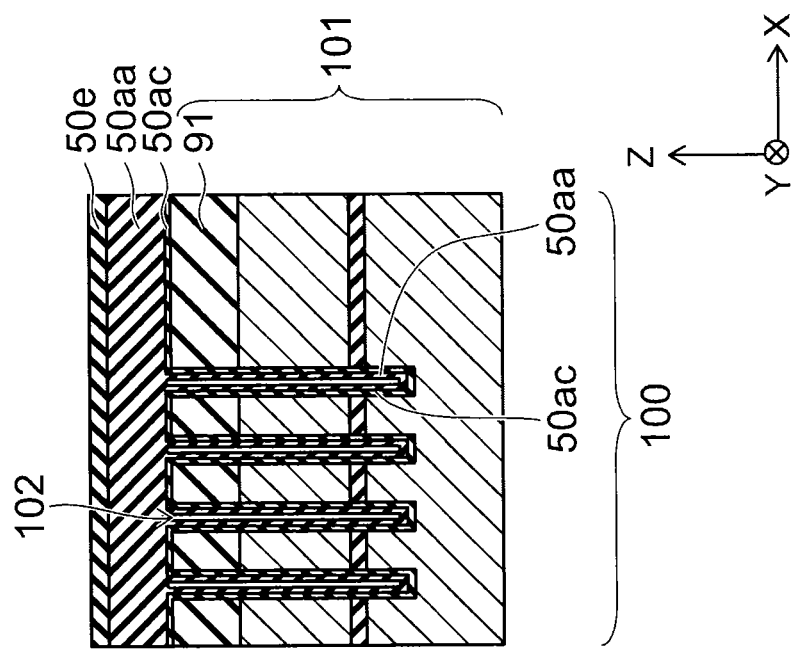

Next, as shown in FIG. 19A and FIG. 19B, the formations of the insulation films 50aa and 80b are performed simultaneously. The materials of the insulating films 50aa and 80b are the same. The insulating films 50aa and 80b are formed by, for example, plasma CVD. The conditions of the plasma CVD are set to such conditions that the trench 102 is not completely filled with the insulating film 50aa.

In this case, in the memory cell region 100, a thin insulating film 50aa is formed on the inner sidewall 102w and the bottom 102d of the trench 102.

After that, the trench 102 is not completely filled with the insulating film 50aa, and the opening of the trench 102 is covered by the insulating film 50aa. Thus, the source gas of the insulating film 50aa does not flow into the trench 102. Consequently, the insulating film 50aa is formed on the plurality of trenches 102.

On the other hand, in the trench 202, since the width in the X-direction of the trench 202 is wider than the width in the X-direction of the trench 102, the opening of the trench 202 is not covered by the insulating film 80b. Consequently, the insulating film 80b is formed along the side surface of the trench 202. As a result, the thickness of the insulating film 80b in the trench 202 is thicker than the thickness of the insulating film 50aa in the trench 102.

Subsequently, as shown in FIG. 19A, in the memory cell region 100, an insulating film 50e is formed on the insulating film 50aa. As shown in FIG. 19B, in the peripheral region 200, the insulating film 80e is formed on the insulating film 80b. The insulating film 50e and the insulating film 80e are formed by, for example, the low pressure CVD method. Here, the materials of the insulating film 50e and the insulating film 80e are the same.

Next, as shown in FIG. 20A, in the memory cell region 100, the resist layer 92 is patterned on the insulating film 50aa other than the cell portion 100c of the memory cell region 100. As shown in FIG. 20B, in the peripheral region 200, the resist layer 92 is formed on the insulating film 80e.

Subsequently, the insulating film 50aa opened from the resist layer 92 is removed by, for example, the RIE method. Consequently, the insulating film 50aa that has been covering the opening of the trench 102 is removed. After that, RIE is further performed, and part of the insulating films 50aa and 50ac provided on the bottom 102d of the trench 102 are removed. Subsequently, the etching conditions of the RIE method are switched to conditions where the etching rate of silicon is higher than the etching rate of the insulating films 50aa and 50ac, and etching is further performed. Consequently, part of the semiconductor layer 10 under each of the plurality of trenches 102 is removed. Thereby, the trench 103 is formed in the semiconductor layer 10 under the trench 102.

In the formation of the trench 103, since the insulating films 50aa and 50ac provided on the inner sidewall 102w of the trench 102 serve as a mask, a step is formed between the trench 102 and the trench 103. Thereby, the width in the X-direction of the trench 103 is narrower than the width in the X-direction of the trench 102. Adjustment is made so that the bottom 103d of the trench 103 is deeper than the bottom 202d of the trench 202.

As shown in FIG. 20B, since the peripheral region 200 is covered with the resist layer 92, the peripheral region 200 is not influenced by the etching. Therefore, in the peripheral region 200, the structure under the resist layer 92 keeps the same state as FIG. 19B.

After that, by a similar process to the first embodiment, the resist layer 92 is removed from the memory cell region 100 and the peripheral region 200. Subsequently, the insulating layer 55 described above is formed in the memory cell region 100. The insulating layer 85 described above is formed in the peripheral region 200. The insulating films 50ac, 50aa, 50e, 80c, 80b, and 80e and the insulating layers 55 and 85 above the charge storage layer 30 are removed by, for example, CMP using the insulating film 91 as a stopper. After that, the upper surfaces of the insulating films 50ac, 50aa, 50e, 80c, 80b, and 80e and the insulating films 55 and 85 are etched to the upper surface of the charge storage layer 30 by the RIE method, for example. After that, the insulating film 91 is removed. This state is shown in FIG. 21A and FIG. 21B.

Figure 21A:
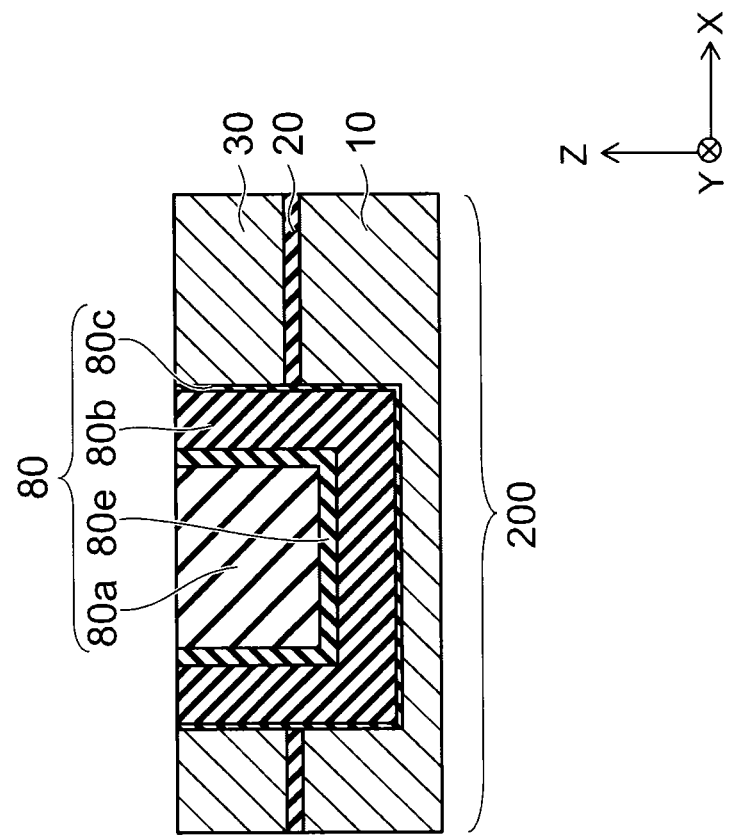

As shown in FIG. 21A, the element isolation region 50 is formed in the memory cell region 100. The element isolation region 50 includes the insulating film 50a (the insulating films 50ac, 50aa, and 50ab) and the insulating film 50b.

Figure 21B:
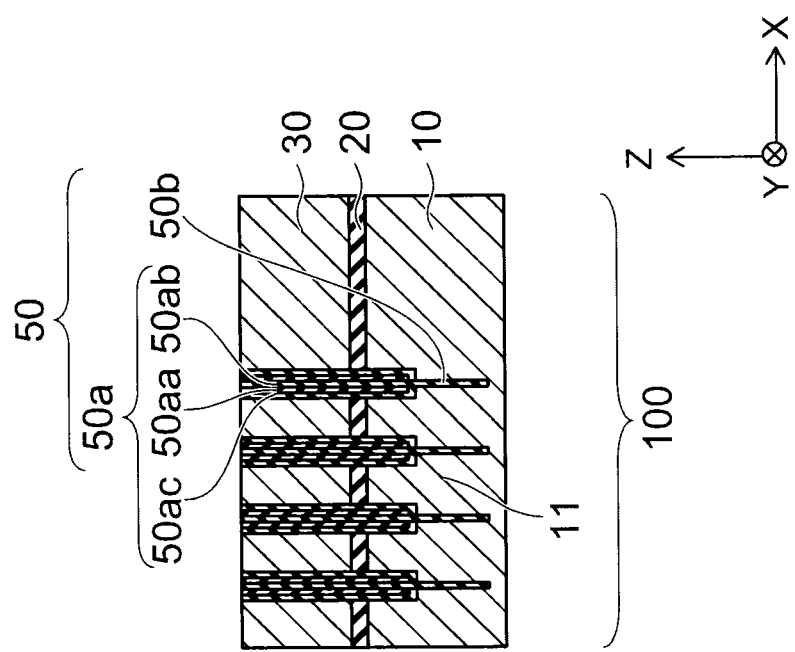

As shown in FIG. 21B, the element isolation region 80 is formed in the peripheral region 200. The element isolation region 80 includes the insulating film 80a, the insulating film 80e, the insulating film 80b, and the insulating film 80c.

Also in the variation, similar effects to the first embodiment are exhibited. Furthermore, by the variation, the effects described below.

The pitch and the width in the X-direction of the trenches 102 change with generations. For example, even by the same film formation time, the thickness of the insulating film 50aa becomes thinner as the pitch of the trenches 102 becomes smaller or the width in the X-direction becomes narrower. However, in accordance with this, the thickness of the insulating film 80b becomes thinner. When the thickness of the insulating film 80b is thin, the function as a stress relaxation layer may be reduced.

However, by the variation, the insulating films 80c and 80e are provided. Thereby, the thickness of the insulating film 80b can be supplemented by the thicknesses of the insulating films 80c and 80e. That is, in the variation, even when the thickness of the insulating film 80b is thin, the insulating film formed of the insulating film 80b and the insulating films 80c and 80e functions as a stress relaxation layer. Thereby, the expansion and contraction of the insulating layer 85 are relaxed by the insulating films 80b, 80c, and 80e, and the stress applied to the semiconductor layer 10 is reduced. Thereby, a crystal defect 15 is less likely to occur in the semiconductor layer 10 regardless of generations.

The density of the insulating film 50ac and the insulating films 80c and 80e formed by low pressure CVD is higher than the density of the insulating layers 55 and 85. Therefore, barrier properties by the insulating films 50ac, 80c, and 80e are improved.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

The term "on" in "a portion A is provided on a portion B" refers to the case where the portion A is provided on the portion B such that the portion A is in contact with the portion B and the case where the portion A is provided above the portion B such that the portion A is not in contact with the portion B.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising a memory cell region and a peripheral region,
   the memory cell region including:
      a plurality of first element isolation regions separating a semiconductor layer in a second direction crossing a first direction, the first element isolation regions including a first insulating film;
      a plurality of first semiconductor regions separated by the first element isolation regions in the second direction and extending in the first direction; and
      a first gate insulating film, a charge storage layer, a second gate insulating film, and a control gate electrode provided on the first semiconductor regions,
   the peripheral region including:
      a second element isolation region separating the semiconductor layer into a plurality of second element regions and including a second insulating film,
   wherein each of the first element isolation regions includes a first portion and a second portion provided under the first portion,
   a step is disposed between the first portion and the second portion,
   at least part of a side surface and a lower end of the second element isolation region are surrounded by the semiconductor layer.

2. The device according to claim 1, wherein a position of the step is shallower than a position of the lower end of the second element isolation region.

3. The device according to claim 1, wherein a position of each lower end of the first element isolation regions is a same as a position of the lower end of the second element isolation region or deeper than the position of the lower end.

4. The device according to claim 1, wherein a width in the second direction of the first portion is wider than a width in the second direction of the second portion.

5. The device according to claim 1, wherein
the first insulating film includes:
   a third insulating film; and
   a fourth insulating film sandwiched by the third insulating film, and
the second insulating film includes:
   a fifth insulating film surrounded by the semiconductor layer; and
   a sixth insulating film surrounded by the fifth insulating film,
the third insulating film and the fifth insulating film include a same material, and a thickness of the fifth insulating film is thicker than a thickness of the third insulating film.

6. The device according to claim 5, wherein a linear contraction coefficient of the sixth insulating film is larger than a linear contraction coefficient of the semiconductor layer.

7. The device according to claim 5, wherein the fourth insulating film and the sixth insulating film are a same material.

8. The device according to claim 5, wherein the first insulating film further includes a seventh insulating film provided between the third insulating film and the fourth insulating film.

9. The device according to claim 5, wherein the second insulating film further includes an eighth insulating film provided between the fifth insulating film and the sixth insulating film.

10. The device according to claim 5, wherein the second insulating film further includes a ninth insulating film provided between the fifth insulating film and the semiconductor layer.

* * * * *